United States Patent
Chu

(10) Patent No.: US 9,826,640 B2
(45) Date of Patent: Nov. 21, 2017

(54) ELECTRONIC APPARATUS

(71) Applicant: E Ink Holdings Inc., Hsinchu (TW)

(72) Inventor: Chun-Wei Chu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/180,101

(22) Filed: Jun. 13, 2016

(65) Prior Publication Data

US 2016/0286648 A1 Sep. 29, 2016

Related U.S. Application Data

(63) Continuation-in-part of application No. 14/220,129, filed on Mar. 19, 2014, now Pat. No. 9,392,086.

(30) Foreign Application Priority Data

Jun. 26, 2013 (TW) .............................. 102122738 A

(51) Int. Cl.
*H05K 1/00* (2006.01)
*H05K 1/14* (2006.01)
(Continued)

(52) U.S. Cl.
CPC ............. *H05K 1/144* (2013.01); *H05K 1/028* (2013.01); *H04M 1/0277* (2013.01);
(Continued)

(58) Field of Classification Search
CPC .. H04M 1/0266; H04M 1/0277; H05K 1/144; H05K 1/147; H05K 1/148;
(Continued)

(56) References Cited

U.S. PATENT DOCUMENTS 3,648,113 A 3/1972 Rathjen et al.
5,313,416 A * 5/1994 Kimura ............... H01L 23/5387
257/E23.177
(Continued)

FOREIGN PATENT DOCUMENTS

CN 1160934 A 10/1997
JP 2002033590 A 1/2002
(Continued)

OTHER PUBLICATIONS

Corresponding Taiwanese Office Action dated Feb. 24, 2015.
Corresponding Chinese Office Action that these art references were cited dated Oct. 9, 2016.

*Primary Examiner* — Yuriy Semenenko
(74) *Attorney, Agent, or Firm* — CKC & Partners Co., Ltd.

(57) ABSTRACT

An electronic apparatus includes a frame, at least one circuit board, at least one hardware device, and at least one first connector. The frame includes a first frame body and a second frame body. The first frame body includes a first wire therein. The circuit board includes a first edge and a second, and at least a portion of the circuit board is flexible. The first edge is connected to the first frame body. The second edge is connected to the second frame body. The circuit board is electrically connected to the first wire. The hardware device is disposed on the circuit board. The first frame body includes a first inner surface, and the first connector is disposed on the first inner surface and electrically connected to the first wire, and the first edge of the circuit board is plugged in the first connector.

20 Claims, 22 Drawing Sheets

(51) Int. Cl.
   *H05K 1/02* (2006.01)
   *H04M 1/02* (2006.01)

(52) U.S. Cl.
   CPC .................. *H05K 2201/042* (2013.01); *H05K 2201/10128* (2013.01); *H05K 2201/2018* (2013.01)

(58) Field of Classification Search
   CPC ......... H05K 2201/042; H05K 2201/05; H05K 2201/10128; H05K 2201/2018; H05K 5/0017; H05K 5/0026; H05K 5/03; H05K 7/1427
   See application file for complete search history.

(56) References Cited

U.S. PATENT DOCUMENTS

| | | | |
|---|---|---|---|
| 5,335,146 A * | 8/1994 | Stucke | H05K 7/1445 174/260 |
| 5,495,389 A | 2/1996 | Dewitt et al. | |
| 5,677,569 A | 10/1997 | Choi et al. | |
| 5,835,988 A | 11/1998 | Ishii | |
| 5,841,638 A | 11/1998 | Purdom | |
| 6,518,659 B1 * | 2/2003 | Glenn | H01L 23/043 257/686 |
| 7,126,829 B1 * | 10/2006 | Yen | H01L 25/105 257/686 |
| 7,957,550 B2 | 6/2011 | Jih-Fon et al. | |
| 2001/0006829 A1 | 7/2001 | Moden et al. | |
| 2006/0066770 A1 | 3/2006 | Hayano et al. | |
| 2011/0037919 A1 * | 2/2011 | Lin | G02F 1/133308 349/58 |
| 2011/0059630 A1 | 3/2011 | Tanaka | |
| 2011/0187692 A1 | 8/2011 | Jung | |
| 2015/0003025 A1 * | 1/2015 | Chu | H04M 1/0277 361/749 |
| 2015/0235766 A1 * | 8/2015 | Nishiyama | H01G 4/012 361/301.4 |

FOREIGN PATENT DOCUMENTS

| | | |
|---|---|---|
| JP | 4764529 B2 | 9/2011 |
| TW | M375902 U | 3/2010 |
| TW | M424624 | 3/2012 |

* cited by examiner

ELECTRONIC APPARATUS

RELATED APPLICATIONS

This application is a Continuation-in-part of U.S. application Ser. No. 14/220,129, filed on Mar. 19, 2014, which claims priority to Taiwanese Application Serial Number 102122738, filed Jun. 26, 2013, all of which are herein incorporated by reference.

BACKGROUND

Technical Field

Embodiments of the present invention relate an electronic apparatus.

Description of Related Art

A small-display electronic apparatus, such as a watch, a cell phone, a GPS device etc., applies rigid circuit boards like PCBs. The manufacturer of the electronic apparatus mounts hardware devices, e.g. a processor, a power supply and a memory, onto the rigid circuit boards.

The hardware devices may be disposed on a multi-layer circuit board, which is formed by multiple closely-laminated circuit boards. The multi-layer circuit board is popular because the circuit layout can be formed on each surface of the circuit boards which significantly increases the total layout area.

However, in that the each circuit board includes a certain thickness and weight, the multi-layer circuit board having plural circuit boards (such as four, five, six, seven or eight circuit boards) may become very thick and heavy, which is adverse to the compact and lightweight design of the electronic apparatus.

SUMMARY

A summary of various embodiments according to the present invention is disclosed below. It should be understood that these aspects are presented merely to provide the reader with a brief summary of these certain embodiments and that these aspects are not intended to limit the scope of this disclosure.

The present invention provides an electronic apparatus that is thinner and lighter than the typical electronic apparatus having multi-layer circuit boards.

In accordance with one embodiment of the present invention, the electronic apparatus includes a frame, a circuit board, a hardware device, and a first connector. The frame includes a first frame body and a second frame body. The first frame body includes a first wire therein. The circuit board includes a first edge and a second edge, and at least a portion of the circuit board is flexible. The first edge is connected to the first frame body. The second edge is connected to the second frame body. The circuit board is electrically connected to the first wire. The hardware device is disposed on the circuit board. The first frame body includes a first inner surface, and the first connector is disposed on the first inner surface and electrically connected to the first wire, and the first edge of the circuit board is plugged in the first connector.

In the foregoing embodiment, the hardware device is disposed on the circuit board, and because the circuit board that is at least partially flexible is thinner and lighter than the typical rigid circuit board, such as the PCB, the electronic apparatus can be thinner and lighter.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
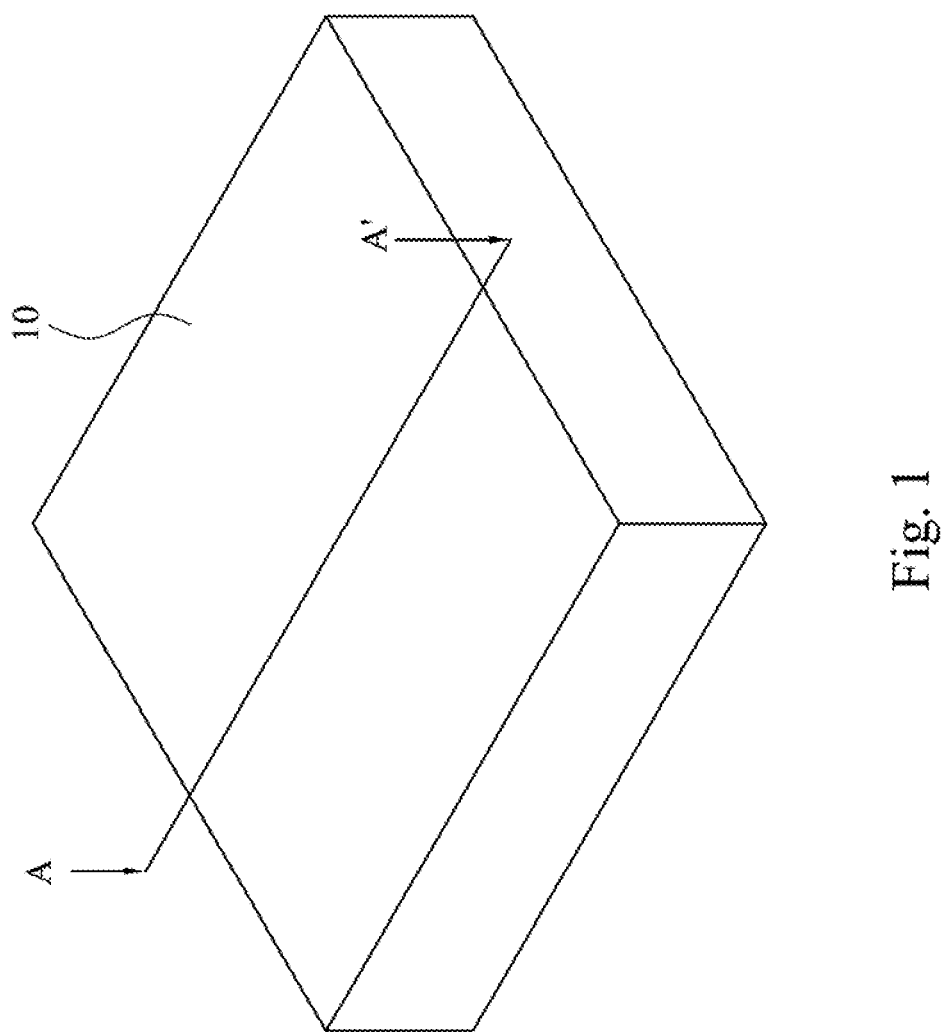
FIG. 1 is a perspective view of an electronic apparatus in accordance with the first embodiment of the present invention.

Reference will now be made in detail to the present embodiments of the invention, examples of which are illustrated in the accompanying drawings. Wherever possible, the same reference numbers are used in the drawings and the description to refer to the same or like parts.

Embodiment 1

Figure 2:
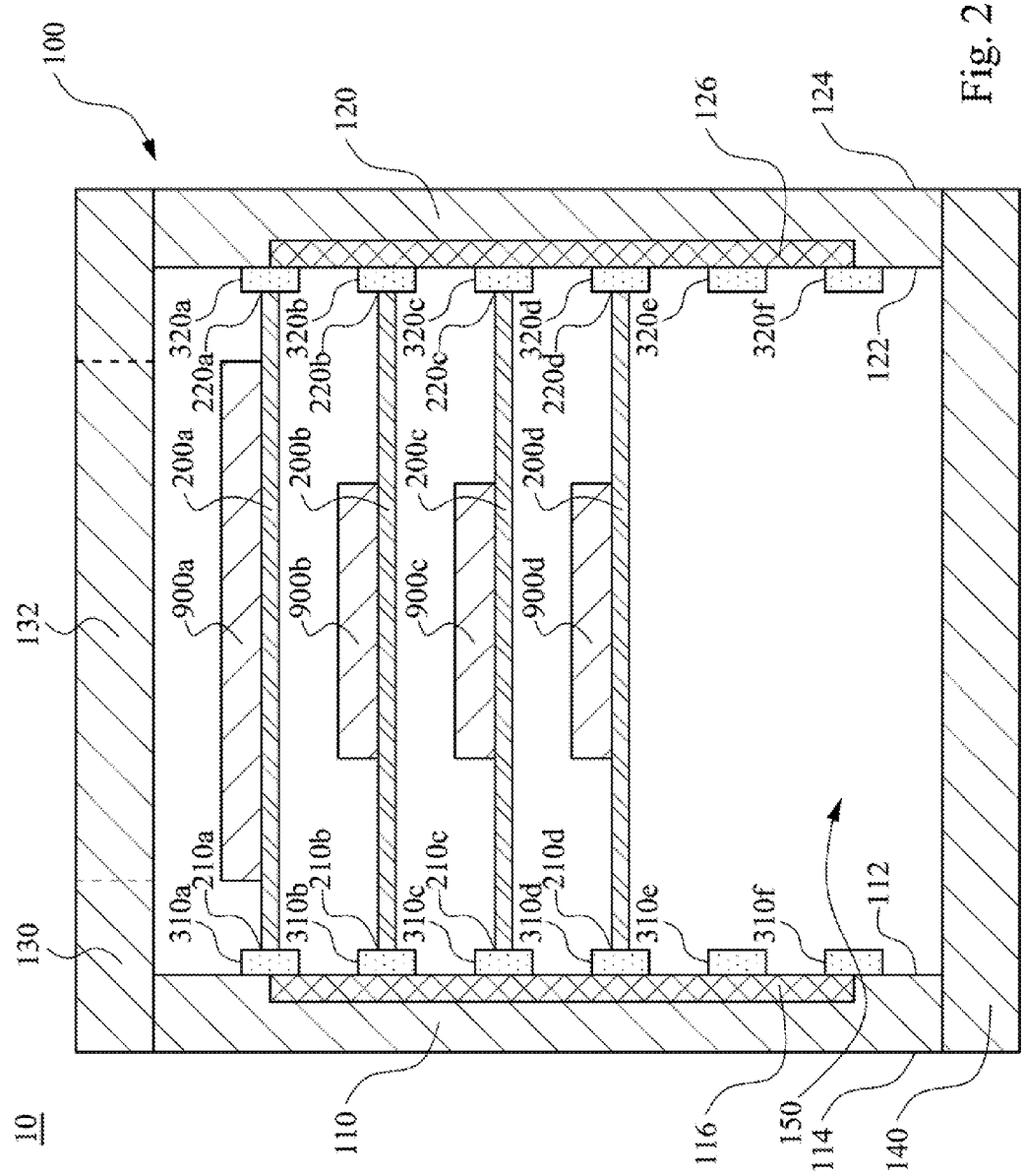
FIG. 2 is a cross-sectional view of the electronic apparatus taken along A-A' line in FIG. 1.

FIG. 1 is a perspective view of an electronic apparatus 10 in accordance with the first embodiment of the present invention. FIG. 2 is a cross-sectional view of the electronic apparatus 10 taken along A-A' line in FIG. 1. As shown in FIG. 2, the electronic apparatus 10 includes a frame 100, a plurality of flexible circuit boards 200*a*, 200*b*, 200*c* and 200*d*, and a plurality of hardware devices 900*a*, 900*b*, 900*c* and 900*d*. The frame 100 includes a first frame body 110, a second frame body 120, a cover 130 and a base 140. The first frame body 110 and the second frame body 120 are disposed on the same surface of the base 140. The first frame body 110 and the second frame body 120 are spaced apart from each other, and define an accommodation space 150 therebetween. The cover 130 is positioned across the first frame body 110 and the second frame body 120, so as to seal the accommodation space 150. The boundary among the first frame body 110, the second frame body 120, the cover 130 and the base 140 are preferably waterproof, so as to prevent the water from getting into the accommodation space 150.

The flexible circuit boards 200*a*, 200*b*, 200*c* and 200*d* are accommodated in the accommodation space 150. The flexible circuit board 200*a* includes a first edge 210*a* and a second edge 220*a* opposite to the first edge 210*a*. The flexible circuit board 200*b* includes a first edge 210*b* and a second edge 220*b* opposite to the first edge 210*b*. The flexible circuit board 200*c* includes a first edge 210*c* and a second edge 220*c* opposite to the first edge 210*c*. The flexible circuit board 200*d* includes a first edge 210*d* and a second edge 220*d* opposite to the first edge 210*d*. The first edges 210*a*, 210*b*, 210*c* and 210*d* are connected to the first frame body 110. The second edges 220*a*, 220*b*, 220*c* and 220*d* are connected to the second frame body 120. In other words, the flexible circuit boards 200*a*, 200*b*, 200*c* and 200*d* are all connected between the first frame body 110 and the second frame body 120. Because the flexible circuit boards 200*a*, 200*b*, 200*c* and 200*d* are spaced apart from each other, the hardware device 900*a* can be disposed on the flexible circuit board 200*a*; the hardware device 900*b* can be disposed on the flexible circuit board 200b; the hardware device 900c can be disposed on the flexible circuit board 200c; and the hardware device 900d can be disposed on the flexible circuit board 200d.

Because the flexible circuit boards 200a, 200b, 200c and 200d are thinner and lighter than the typical PCB, the electronic apparatus 10 can be thinner and lighter.

In this embodiment, the first frame body 110 includes a first wire 116 therein. The flexible circuit boards 200a, 200b, 200c and 200d are all electrically connected to the first wire 116. In detail, the first frame body 110 includes a first inner surface 112 and a first outer surface 114. The first inner surface 112 faces toward the second frame body 120, and the first outer surface 114 is opposite to the second frame body 120. The first wire 116 can be positioned between the first inner surface 112 and the first outer surface 114. The electronic apparatus 10 includes a plurality of first connectors 310a, 310b, 310c and 310d. The first connectors 310a, 310b, 310c and 310d are disposed on the first inner surface 112 of the first frame body 110 and electrically connected to the first wire 116. The first edge 210a of the flexible circuit board 200a is plugged in the first connector 310a, so that the first connector 310a can secure the first edge 210a, and the conductive pattern or the wire (not shown) on the first edge 210a can be electrically connected to the first wire 116 via the first connector 310a. The first edge 210b of the flexible circuit board 200b is plugged in the first connector 310b, so that the first connector 310b can secure the first edge 210b, and the conductive pattern or the wire (not shown) on the first edge 210b can be electrically connected to the first wire 116 via the first connector 310b. The first edge 210c of the flexible circuit board 200c is plugged in the first connector 310c, so that the first connector 310c can secure the first edge 210c, and the conductive pattern or the wire (not shown) on the first edge 210c can be electrically connected to the first wire 116 via the first connector 310c. The first edge 210d of the flexible circuit board 200d is plugged in the first connector 310d, so that the first connector 310d can secure the first edge 210d, and the conductive pattern or the wire (not shown) on the first edge 210d can be electrically connected to the first wire 116 via the first connector 310d.

In other words, the flexible circuit boards 200a, 200b, 200c, and 200d can be electrically connected to the first wire 116 via the first connector 310a, 310b, 310c and 310d, so that the hardware devices 900a, 900b, 900c and 900d can be electrically connected to each other and can transfer the signals to each other.

For example, the hardware device 900a can be, but is not limited to be, a display device, such as an LCD (liquid crystal display) or an EPD (electro-phoretic display). The hardware device 900b can be, but is not limited to be, a wireless transmission module, such as a bluetooth module and a Wifi module. The hardware device 900c can be a processor. The hardware device 900d can be a power source. The display device, the wireless transmission device, the processor and the power source can be electrically connected to each other via the first wire 116. As such, the power source can provide electric power to the display device, the wireless transmission device and the processor. When the wireless transmission module receives a wireless signal from an external device (not shown), it can transmit the wireless signal to the processor. The processor can control the display device to show corresponding images based on the wireless signal.

In this embodiment, the second frame body 120 includes a second wire 126 therein. In addition to the first wire 116, the flexible circuit boards 200a, 200b, 200c, and 200d can also be electrically connected to the second wire 126. In other words, the flexible circuit boards 200a, 200b, 200c, and 200d can electrically connected between the first wire 116 within the first frame body 110 and the second wire 126 within the second frame body 120.

In detail, the second frame body 120 includes a second inner surface 122 and a second outer surface 124. The second inner surface 122 faces toward the first frame body 110, and the second outer surface 124 is opposite to the first frame body 110. The second wire 126 can be positioned between the second inner surface 122 and the second outer surface 124. The electronic apparatus 10 includes a plurality of second connectors 320a, 320b, 320c and 320d. The second connectors 320a, 320b, 320c and 320d are disposed on the second inner surface 122 of the second frame body 120 and electrically connected to the second wire 126. The second edge 220a of the flexible circuit board 200a is plugged in the second connector 320a, so that the second connector 320a can secure the second edge 220a, and the conductive pattern or the wire (not shown) on the second edge 220a can be electrically connected to the second wire 126 via the second connector 320a. The second edge 220b of the flexible circuit board 200b is plugged in the second connector 320b, so that the second connector 320b can secure the second edge 220b, and the conductive pattern or the wire (not shown) on the second edge 220b can be electrically connected to the second wire 126 via the second connector 320b. The second edge 220c of the flexible circuit board 200c is plugged in the second connector 320c, so that the second connector 320c can secure the second edge 220c, and the conductive pattern or the wire (not shown) on the second edge 220c can be electrically connected to the second wire 126 via the second connector 320c. The second edge 220d of the flexible circuit board 200d is plugged in the second connector 320d, so that the second connector 320d can secure the second edge 220d, and the conductive pattern or the wire (not shown) on the second edge 220d can be electrically connected to the second wire 126 via the second connector 320d.

In other words, the flexible circuit boards 200a, 200b, 200c, and 200d can be electrically connected to the first wire 126 via the second connector 320a, 320b, 320c and 320d, so that the hardware devices 900a, 900b, 900c and 900d can be electrically connected to each other via the first wire 116 and the second wire 126.

In this embodiment, when the flexible circuit board 200a is not bended, the distance between the first edge 210a and the second edge 220a approximately equals to the distance between the first connector 310a and the second connector 320a. Therefore, when the first edge 210a is plugged in the first connector 310a, and the second edge 310b is plugged in the second connector 320a, the flexible circuit board 200a can be tensioned, instead of drooping due to the weight of the hardware device 900a.

Similarly, when the flexible circuit board 200b is not bended, the distance between the first edge 210b and the second edge 220b approximately equals to the distance between the first connector 310b and the second connector 320b. When the flexible circuit board 200c is not bended, the distance between the first edge 210c and the second edge 220c approximately equals to the distance between the first connector 310c and the second connector 320c. Therefore, the flexible circuit boards 200b, 200c and 200d can also be tensioned, not drooping.

In this embodiment, the electronic apparatus 10 includes first connectors 310e, 310f, and second connectors 320e and 320f. The first connector 310e is aligned with the second connector 320e, and the first connector 310f is aligned with the second connector 320f. As such, the user can plug additional flexible circuit boards depending on the demand. In contrary, the user can also remove the flexible circuit board 200a, 200b, 200c or 200d depending on the demand. In other words, the user can replace the flexible circuit boards and the hardware devices thereon, so the electronic apparatus 10 can be widely applied on various products, such as the watch or the cell phone.

In this embodiment, the cover 130 has a light-transmissive area 132. The projection position of the light-transmissive area 132 on the flexible circuit board 200a overlaps with the hardware device 900a. In other words, the light-transmissive area 132 is positioned exactly above the hardware device 900a. Therefore, when the hardware device 900a is the display device, the user can see the image shown on the display device through the light-transmissive area 132.

In this embodiment, the flexible circuit boards 200a, 200b, 200c and 200d can be, but is not limited to be, an FPC (flexible printed circuit).

Figure 3:
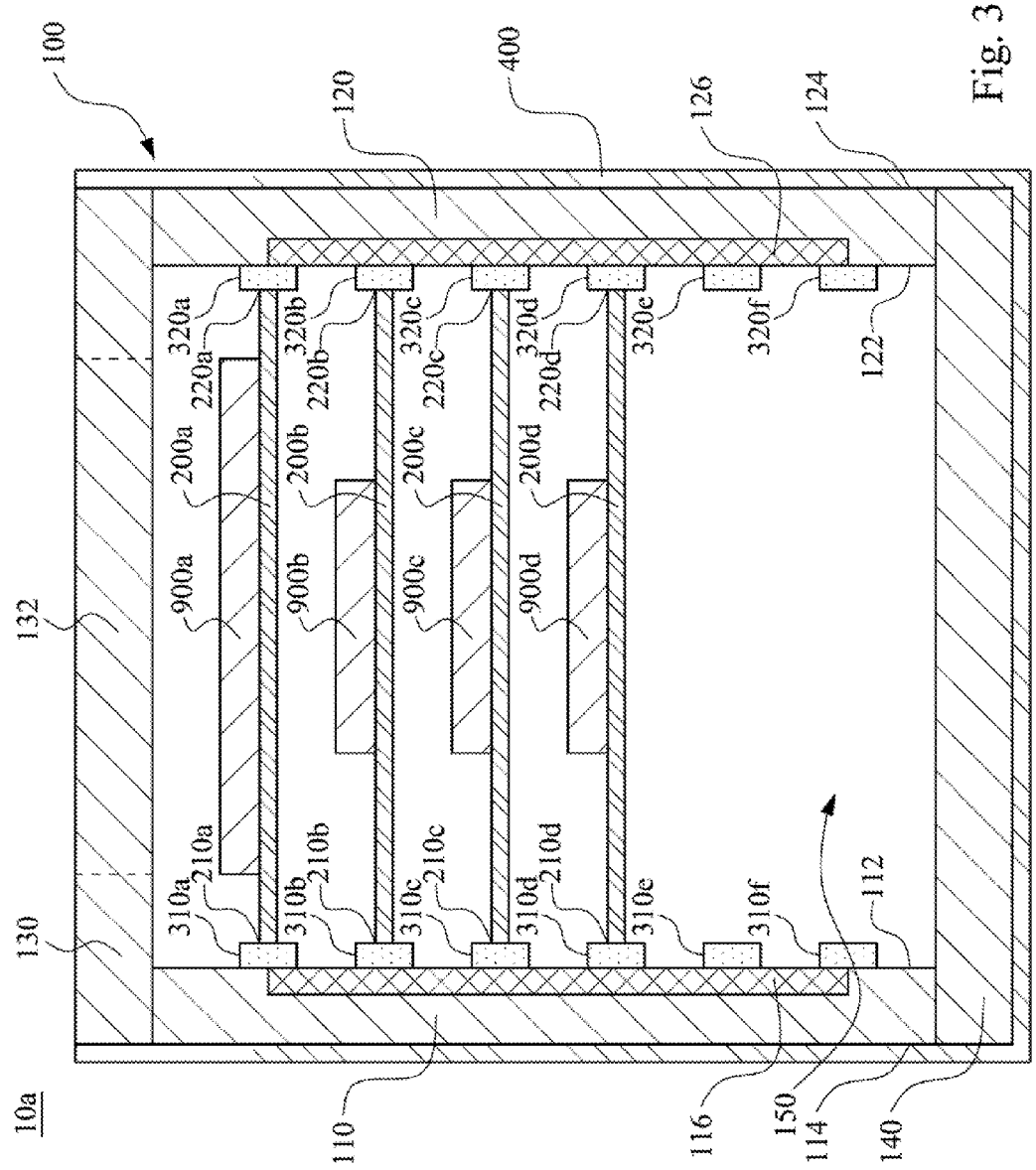
FIGS. 3-22 are cross-sectional views of the electronic apparatuses in accordance with different embodiments of the present invention.

FIG. 3 is a cross-sectional view of the electronic apparatus 10a in accordance with the second embodiment of the present invention. As shown in FIG. 3, the main difference between this embodiment and FIG. 2 is that: the electronic apparatus 10a includes an antistatic layer 400. The antistatic layer 400 is disposed on the frame 100. For example, the antistatic layer 400 can be the metal coating layer at least covering the first outer surface 114 of the first frame body 110 and the second outer surface 124 of the second frame body 120, so as to prevent the flexible circuit boards 200a, 200b, 200c, 200d and the hardware devices 900a, 900b, 900c and 900d from affected by the static electricity.

Figure 4:
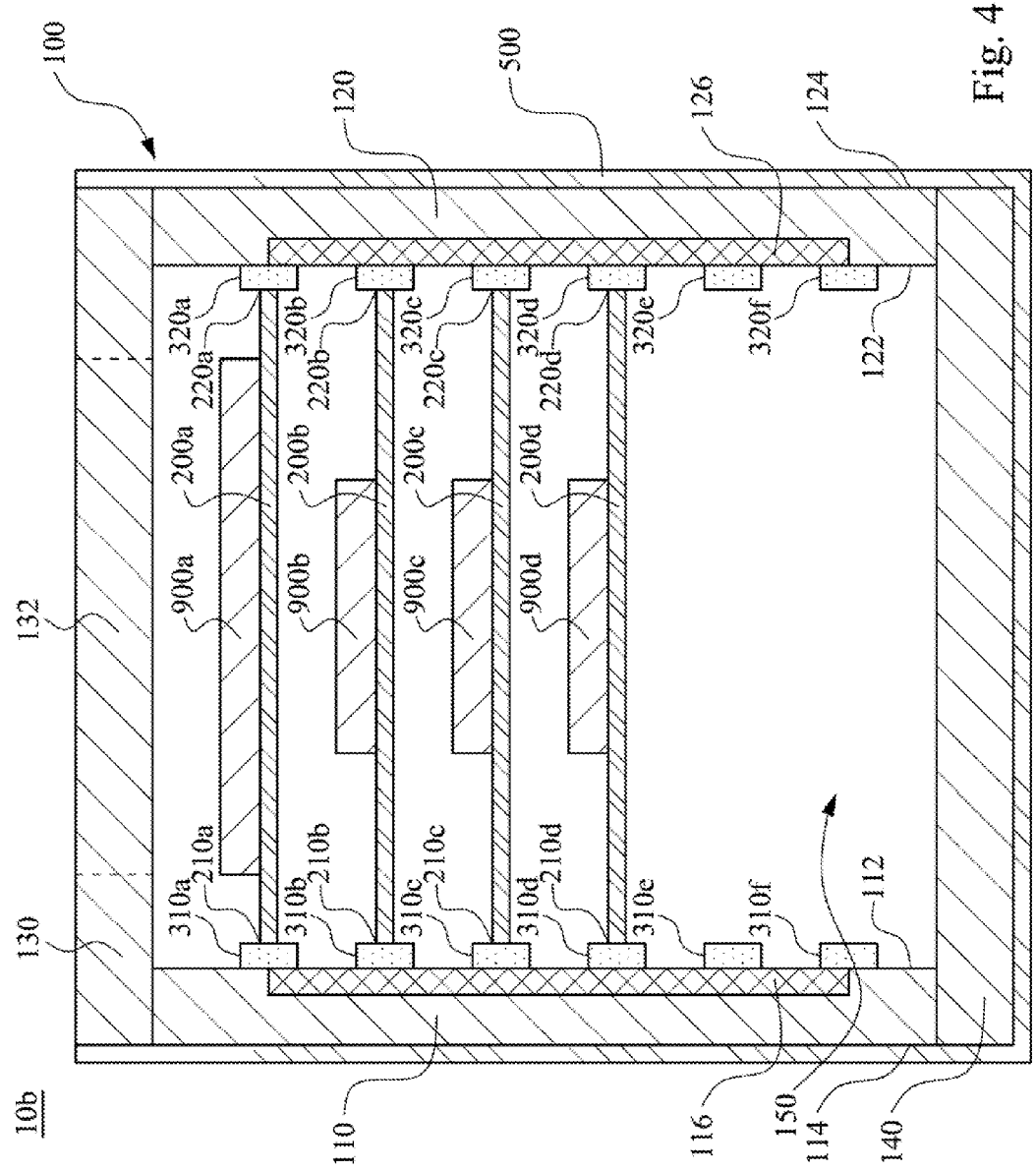

FIG. 4 is a cross-sectional view of the electronic apparatus 10b in accordance with the third embodiment of the present invention. As shown in FIG. 4, the main difference between this embodiment and FIG. 2 is that: the electronic apparatus 10b includes a waterproof layer 500. The waterproof layer 500 is disposed on the frame 100. For example, the waterproof layer 500 can be the PTFE (polytetrafluoroethene) at least covering the first outer surface 114 of the first frame body 110 and the second outer surface 124 of the second frame body 120, so as to prevent the flexible circuit boards 200a, 200b, 200c, 200d and the hardware devices 900a, 900b, 900c and 900d from affected by the water.

Figure 5:
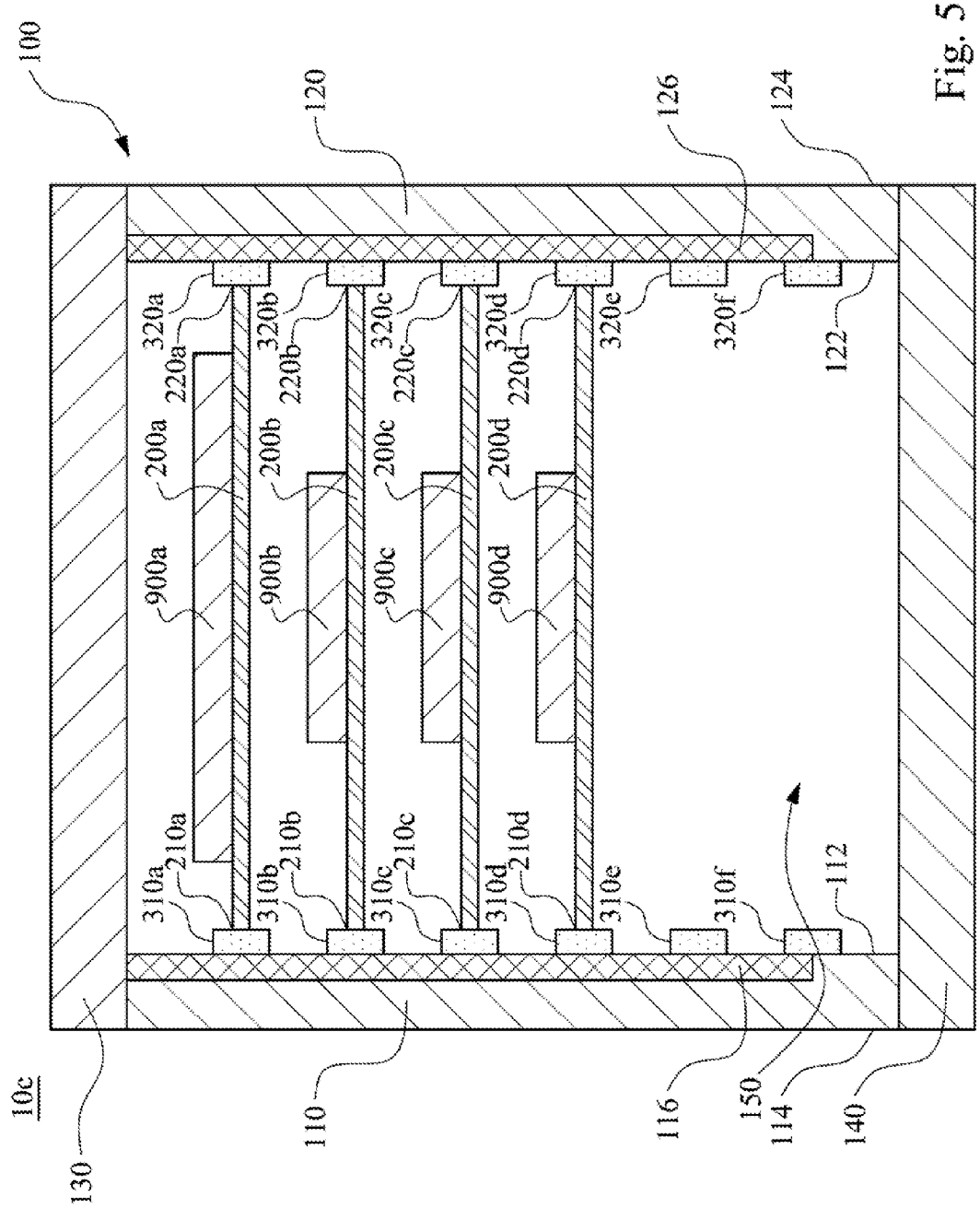

FIG. 5 is a cross-sectional view of the electronic apparatus 10c in accordance with the fourth embodiment of the present invention. As shown in FIG. 5, the main difference between this embodiment and FIG. 2 is that: the cover 130 of the electronic apparatus 10c of this embodiment is a touch panel. The first wire 116 and the second wire 126 can be electrically connected to the touch panel. Therefore, the user can touch the cover 130 (touch panel) to operate the electronic apparatus 10c.

Figure 6:
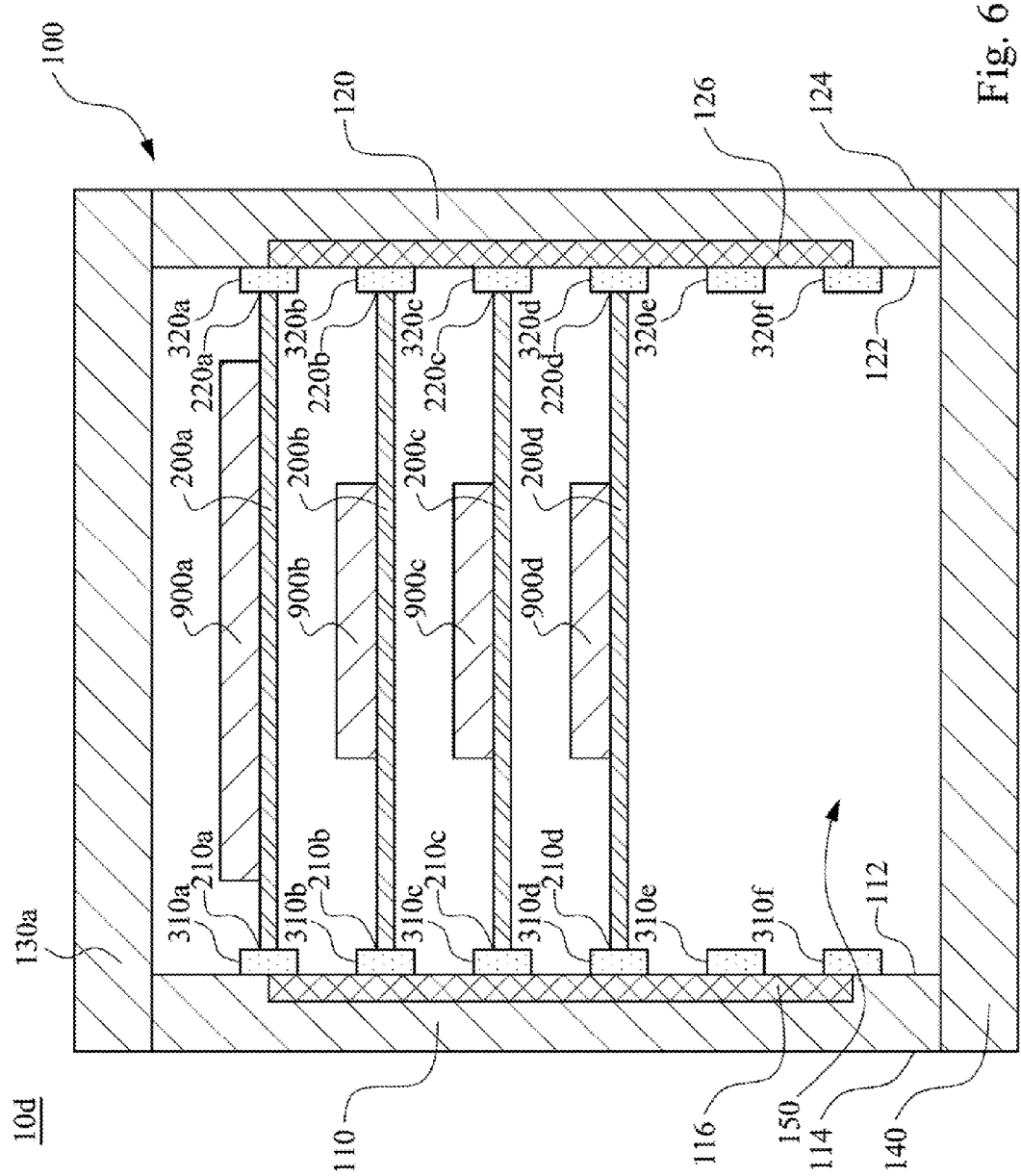

FIG. 6 is a cross-sectional view of the electronic apparatus 10d in accordance with the fifth embodiment of the present invention. As shown in FIG. 6, the main difference between this embodiment and FIG. 2 is that: the cover 130a doesn't include the light-transmissive area 132 (See FIG. 2). In other words, the entire area of the cover 130a is opaque.

Figure 7:
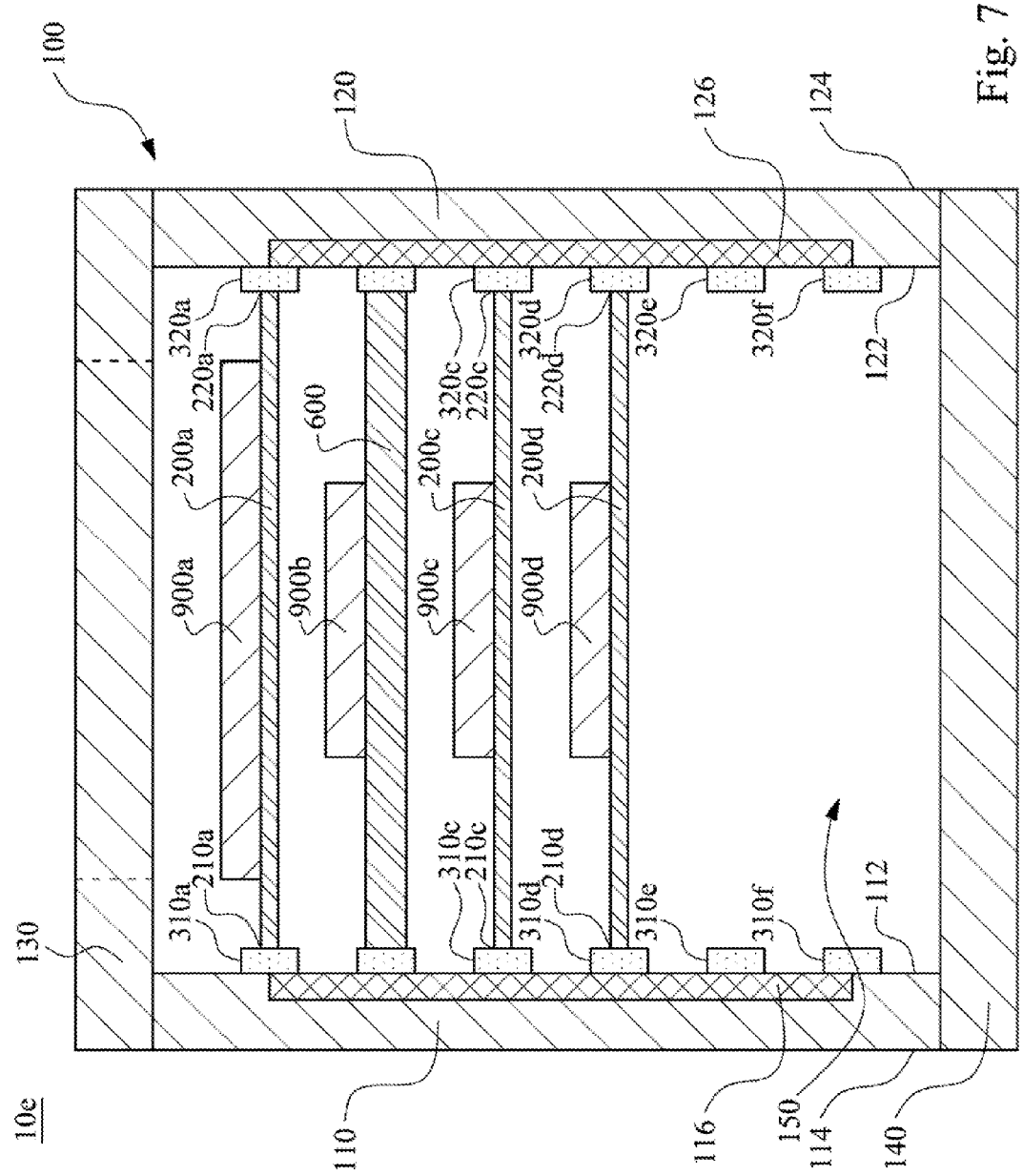

FIG. 7 is a cross-sectional view of the electronic apparatus 10e in accordance with the sixth embodiment of the present invention. As shown in FIG. 7, the main difference between this embodiment and FIG. 2 is that: the electronic apparatus 10e includes at least one rigid circuit board 600. The rigid circuit board 600 is accommodated in the accommodation space 150. The flexural strength of the flexible circuit boards 200a, 200c and 200d is greater than the flexural strength of the rigid circuit board 600. In other words, the rigid circuit board 600 cannot be bended. Therefore, the rigid circuit board 600 can improve the structural strength of the frame 100, thereby keeping the flexible circuit boards 200a, 200c and 200d tensioned, and preventing them from drooping.

Figure 8:
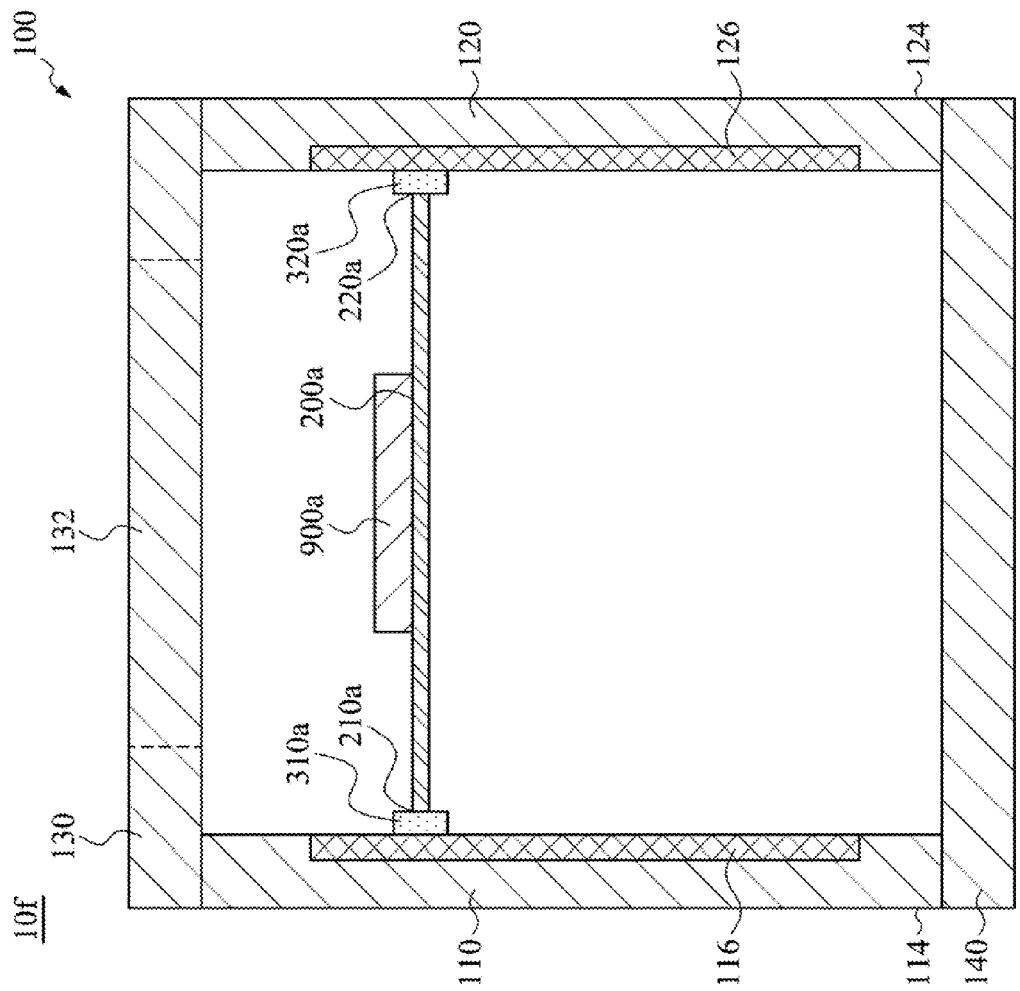

FIG. 8 is a cross-sectional view of the electronic apparatus 10f in accordance with the seventh embodiment of the present invention. As shown in FIG. 8, the main difference between this embodiment and FIG. 2 is that: the electronic apparatus 10f includes a single flexible circuit board 200a, a single first connector 310a and a single second connector 320a. Other flexible circuit boards, first connectors and second connectors are omitted in this embodiment.

Figure 9:
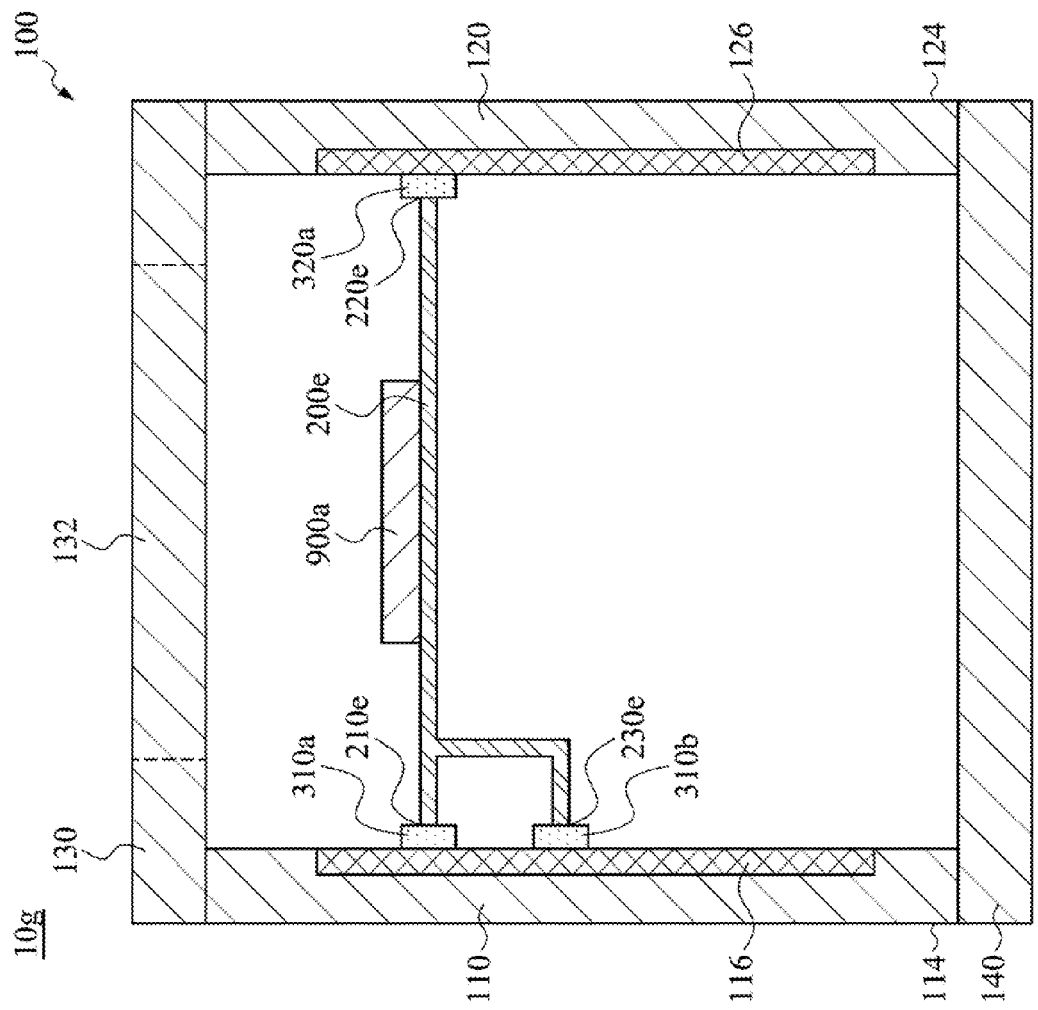

FIG. 9 is a cross-sectional view of the electronic apparatus 10g in accordance with the eighth embodiment of the present invention. As shown in FIG. 9, the main difference between this embodiment and FIG. 8 is that: the single flexible circuit board 200e is connected to a plurality of first connectors 310a and 310b and a single second connector 320a. In other words, an amount of at least one flexible circuit board, an amount of at least one first connector and an amount of at least one second connector are unequal in this embodiment. However, in some embodiments, as shown in FIG. 8, an amount of at least one flexible circuit board, an amount of at least one first connector and an amount of at least one second connector are equal. In some embodiments, the flexible circuit board 200e includes first, second and third edges 210e, 220e and 230e. The first edge 210e is plugged in the first connector 310a, the second edge 220e is plugged in the second connector 320a, and the third edge 230e is plugged in the first connector 310b.

Figure 10:
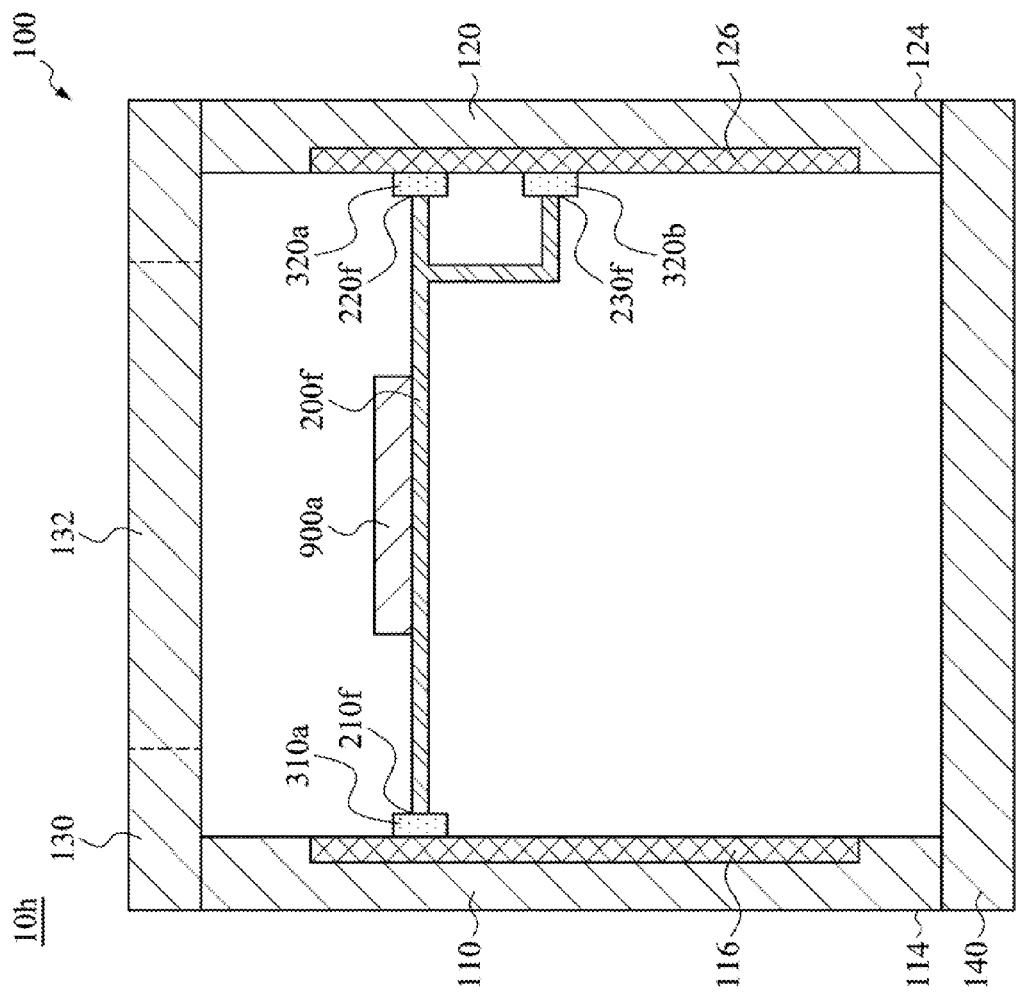

FIG. 10 is a cross-sectional view of the electronic apparatus 10h in accordance with the ninth embodiment of the present invention. As shown in FIG. 10, the main difference between this embodiment and FIG. 8 is that: the single flexible circuit board 200f is connected to a single first connector 310a and a plurality of second connector 320a and 320b. In some embodiments, the flexible circuit board 200f includes first, second and third edges 210f, 220f and 230f. The first edge 210f is plugged in the first connector 310a, the second edge 220f is plugged in the second connector 320a, and the third edge 230f is plugged in the second connector 320b.

Figure 11:
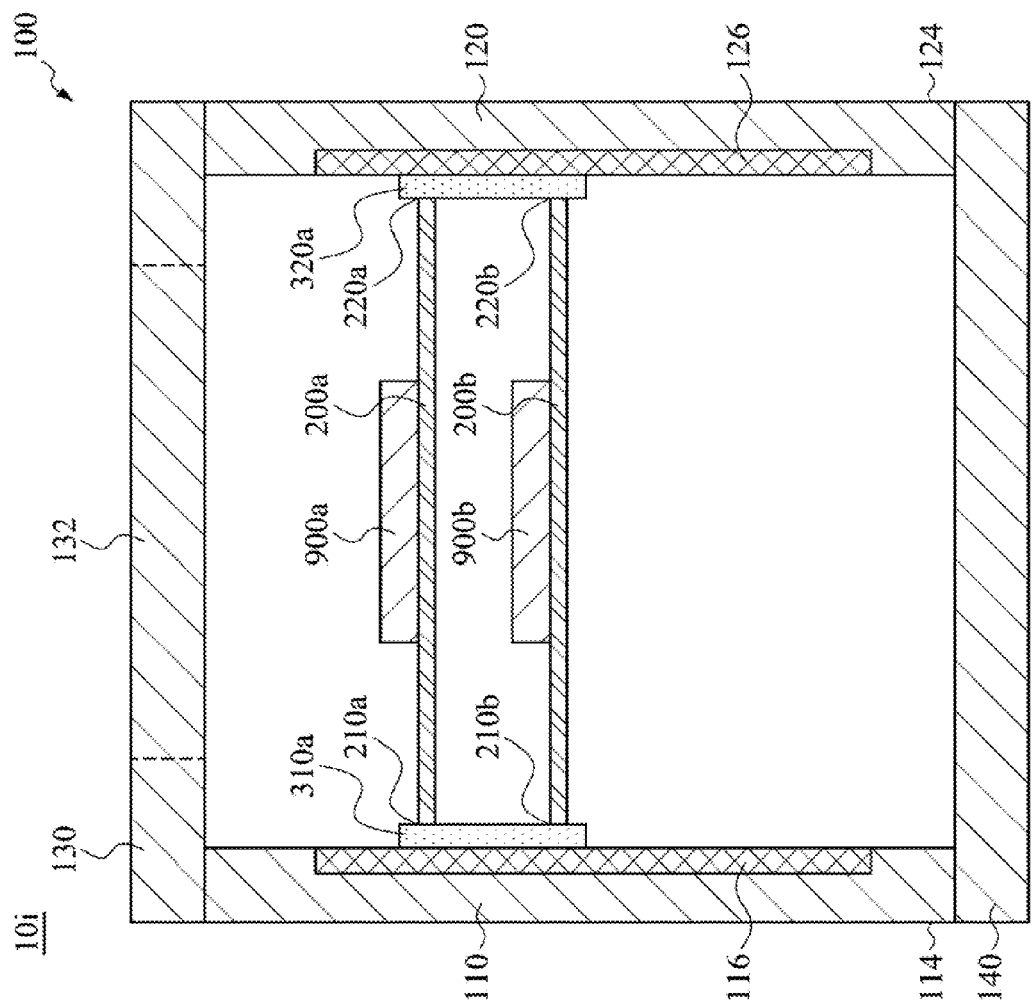

FIG. 11 is a cross-sectional view of the electronic apparatus 10i in accordance with the tenth embodiment of the present invention. As shown in FIG. 11, the main difference between this embodiment and FIG. 8 is that: a plurality of flexible circuit boards 200a and 200b are connected to a single first connector 310a and a single second connector 320a. For example, both the first edges 210a and 210b of the flexible circuit boards 200a and 200b are plugged in the single first connector 310a. For example, the single first connector 310a may include a plurality of slots respectively receiving the first edges 210a and 210b. Similarly, both the second edges 220a and 220b of the flexible circuit boards 200a and 200b are plugged in the single second connector 320a. For example, the single second connector 320a may include a plurality of slots respectively receiving the second edges 220a and 220b.

Figure 12:
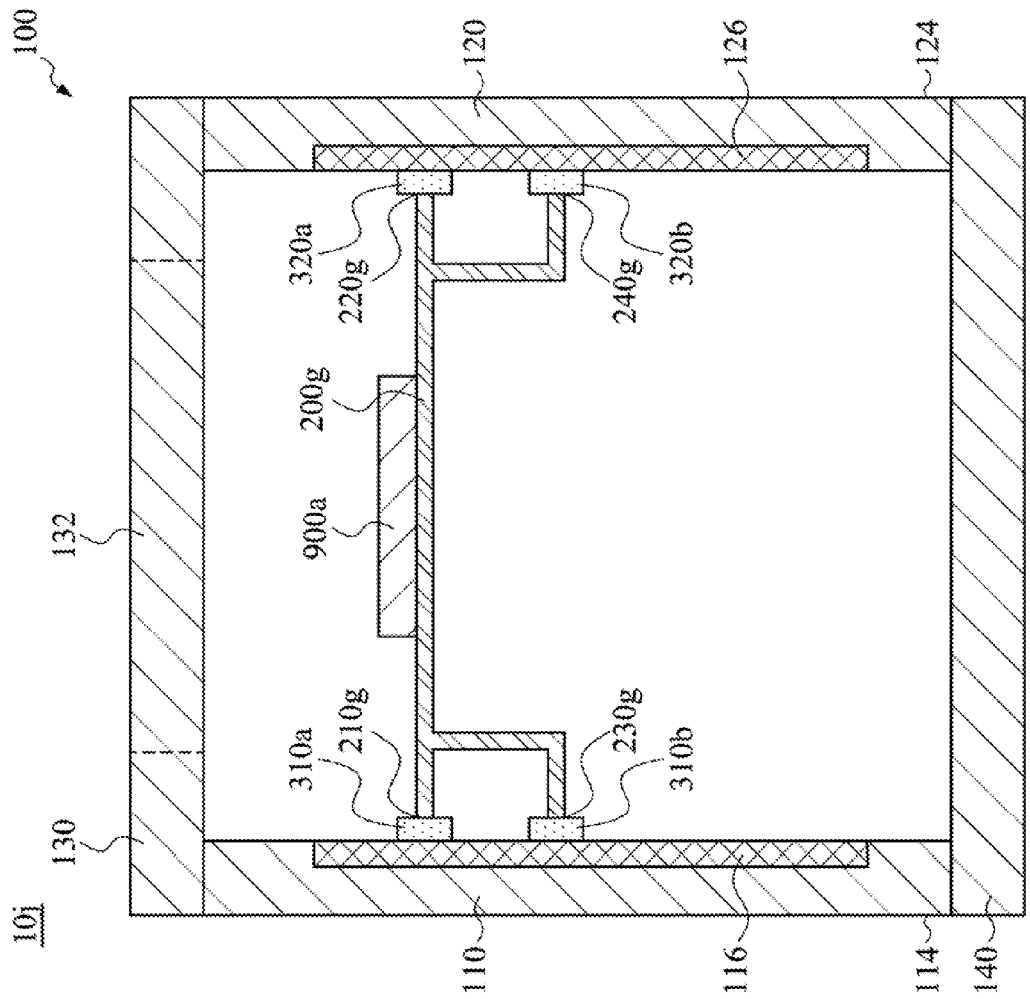

FIG. 12 is a cross-sectional view of the electronic apparatus 10j in accordance with the eleventh embodiment of the present invention. As shown in FIG. 12, the main difference between this embodiment and FIG. 8 is that: a single flexible circuit board 200g is connected to a plurality of first connectors 310a and 310b and a plurality of second connectors 320a and 320b. For example, the single flexible circuit board 200g includes first, second, third and fourth edges 210g,

220g, 230g and 240g. The first edge 210g is plugged in the first connector 310a, the second edge 220g is plugged in the second connector 320a, the third edge 230g is plugged in the first connector 310b, and the fourth edge 240g is plugged in the second connector 320b.

Figure 13:
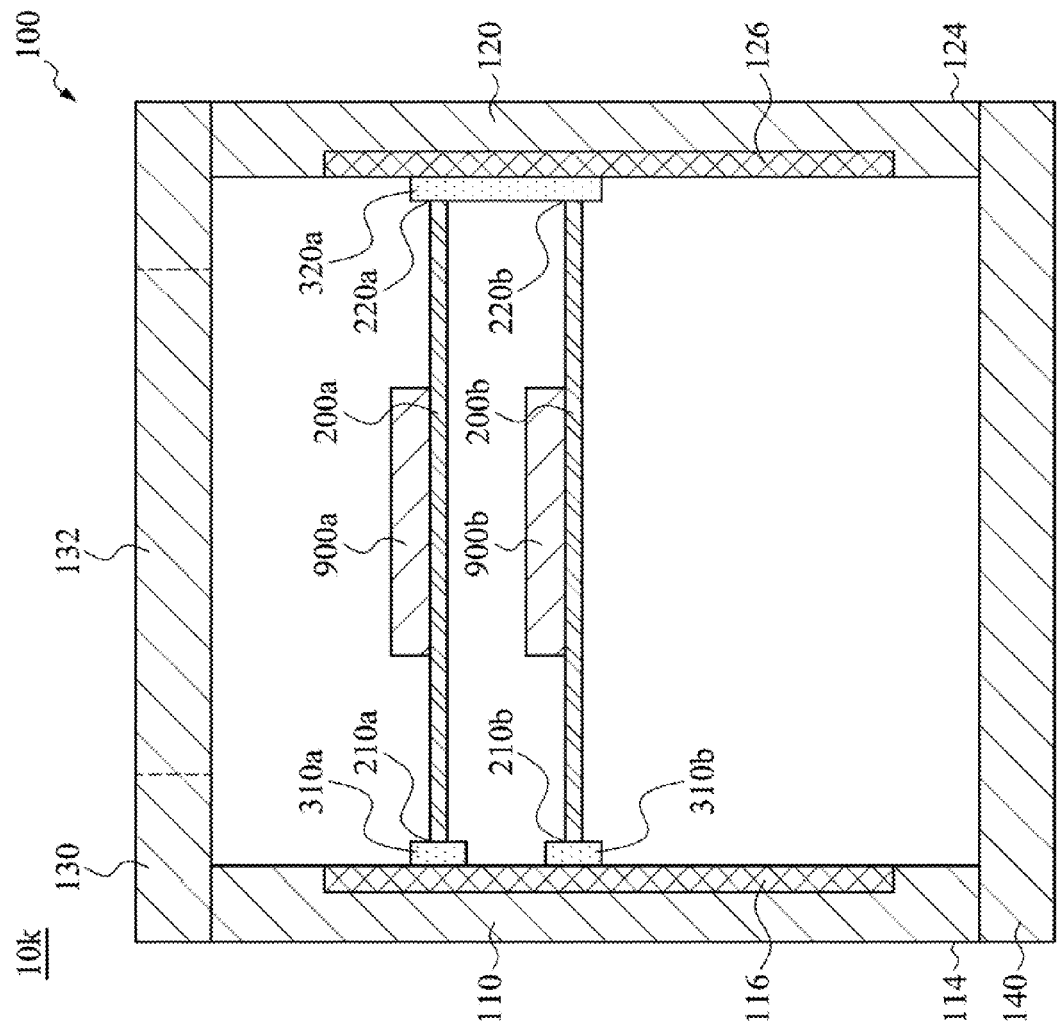

FIG. 13 is a cross-sectional view of the electronic apparatus 10k in accordance with the twelfth embodiment of the present invention. As shown in FIG. 13, the main difference between this embodiment and FIG. 8 is that: a plurality of flexible circuit boards 200a and 200b are connected to a plurality of first connectors 310a and 310b and a single second connector 320a. For example, the first edges 210a and 210b of the flexible circuit boards 200a and 200b are respectively plugged in the first connectors 310a and 310b, and both the second edges 220a and 220b of the flexible circuit boards 200a and 200b are plugged in the single second connector 320a. For example, the second connector 320a may include a plurality of slots that respectively receive the second edges 220a and 220b of the flexible circuit boards 200a and 200b.

Figure 14:
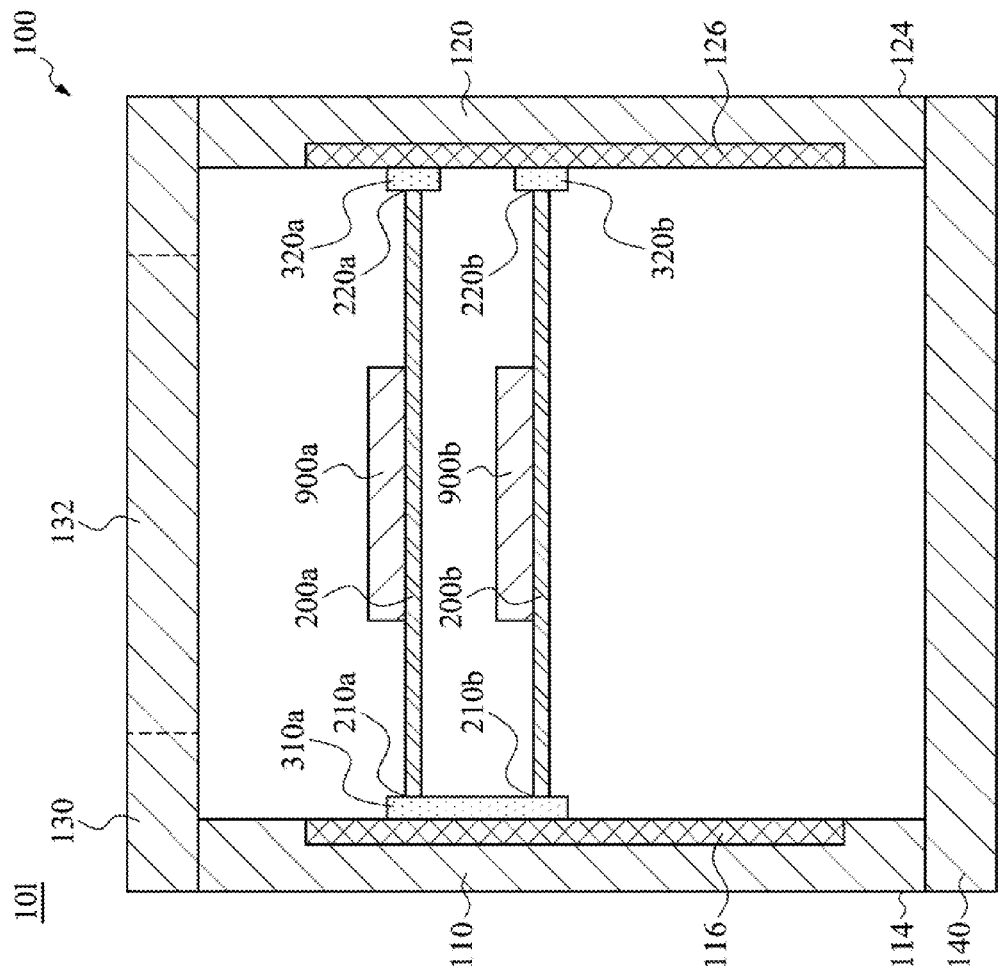

FIG. 14 is a cross-sectional view of the electronic apparatus 10l in accordance with the thirteenth embodiment of the present invention. As shown in FIG. 14, the main difference between this embodiment and FIG. 8 is that: a plurality of flexible circuit boards 200a and 200b are connected to a single first connector 310a and a plurality of second connectors 320a and 320b. For example, both the first edges 210a and 210b of the flexible circuit boards 200a and 200b are plugged in the single first connector 310a, and the second edges 220a and 220b of the flexible circuit boards 200a and 200b are respectively plugged in the second connectors 320a and 320b. For example, the single first connector 310a may include a plurality of slots that respectively receive the first edges 210a and 210b of the flexible circuit boards 200a and 200b.

Figure 15:
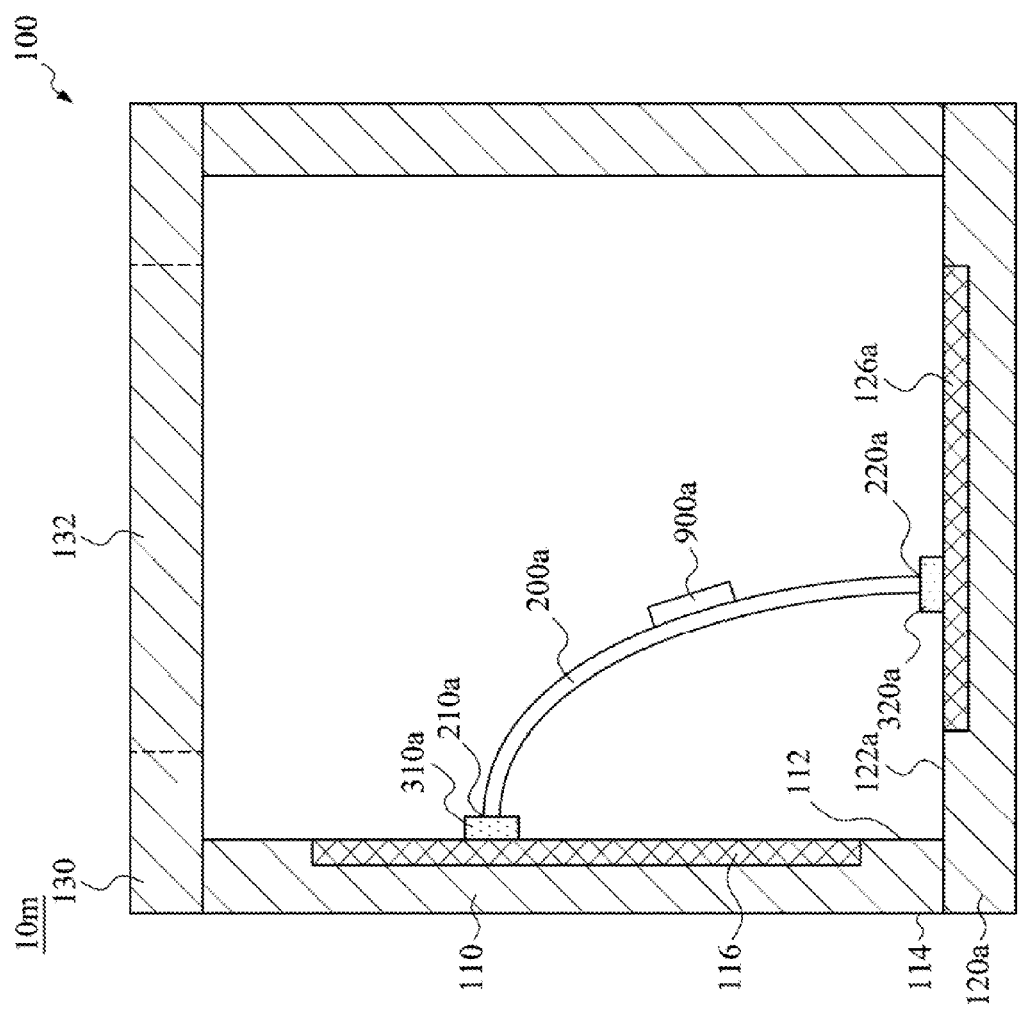

FIG. 15 is a cross-sectional view of the electronic apparatus 10m in accordance with the fourteenth embodiment of the present invention. As shown in FIG. 15, the main difference between this embodiment and FIG. 8 is that: the first frame body 110 and the second frame body 120a are not opposite. Instead, the first frame body 110 and the second frame body 120a are adjacent. The flexible circuit board 200a is connected to the adjacent first and second frame bodies 110 and 120a, rather than connected to opposite frame bodies. In some embodiments, the second frame body 120a includes a second inner surface 122a that is adjacent to the first inner surface 112. The second edge 220a of the flexible circuit board 200a is connected to the second inner surface 122a. In particular, the second connector 320a is disposed on the second inner surface 122a and electrically connected to the second wire 126a in the second frame body 120a, and the second edge 220a is plugged in the second connector 320a on the second inner surface 122a that is adjacent to the first inner surface 112. In some embodiments, a portion of the base 140 such as which is shown in FIG. 14 may serve as the second frame body 120a.

In some other embodiments, the first and second frame bodies may be not opposite and not adjacent. For example, the first and second frame bodies may be two plates of a polyhedral structure that are not opposite and not adjacent.

Figure 16:
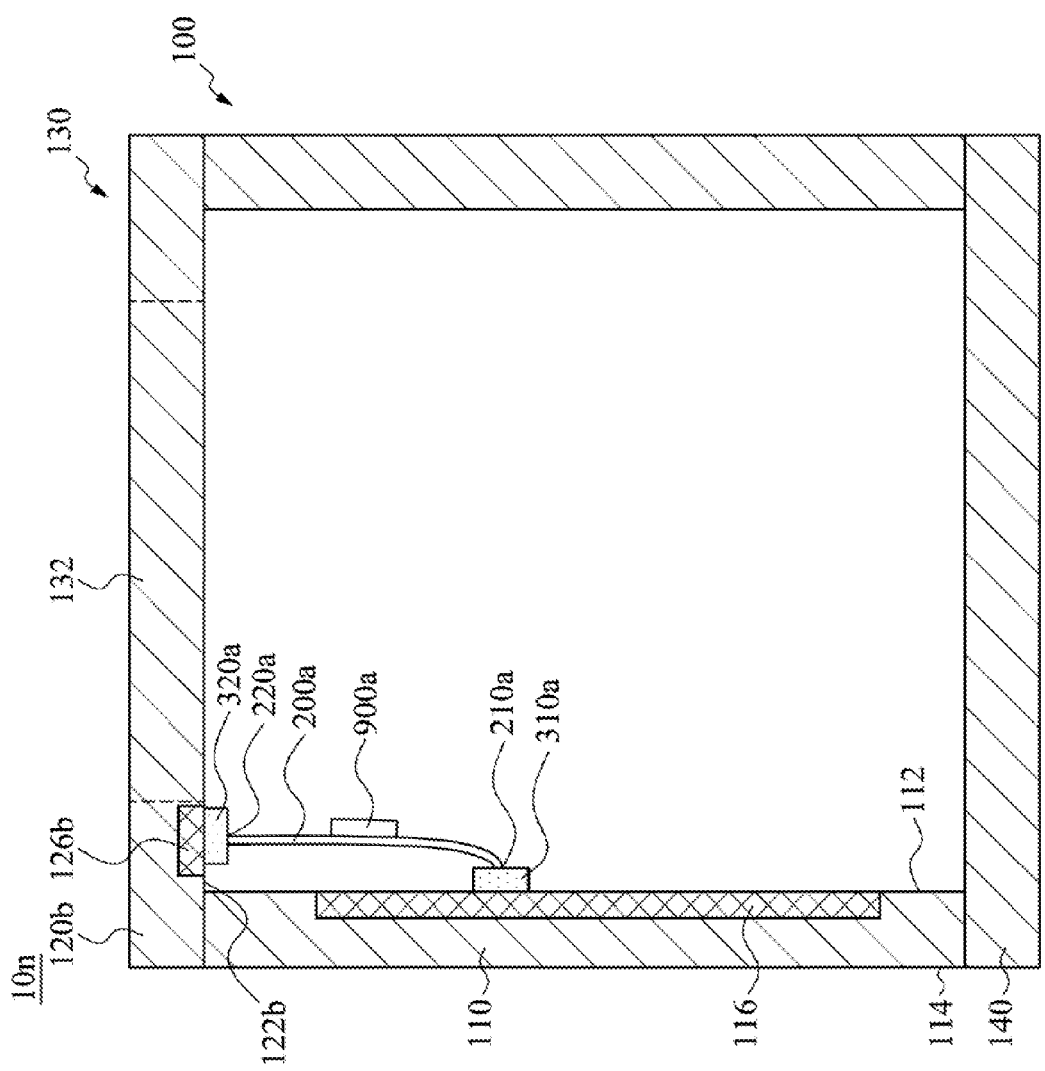

FIG. 16 is a cross-sectional view of the electronic apparatus 10n in accordance with the fifteenth embodiment of the present invention. As shown in FIG. 16, the main difference between this embodiment and FIG. 8 is that: a portion of the cover 130 that is adjacent to the first frame body 110 may serve as the second frame body 120b. In other words, the second frame body 120b is adjacent to the first frame body 110 and overlies the first frame body 110. The flexible circuit board 200a is connected to the adjacent first and second frame bodies 110 and 120b, rather than connected to opposite frame bodies. In some embodiments, the second frame body 120b which is a portion of the cover 130 includes a second inner surface 122b that is adjacent to the first inner surface 112. The second edge 220a of the flexible circuit board 200a is connected to the second inner surface 122b. In particular, the second connector 320a is disposed on the second inner surface 122b and electrically connected to the second wire 126b in the second frame body 120b, and the second edge 220a is plugged in the second connector 320a on the second inner surface 122b that is adjacent to the first inner surface 112.

Figure 17:
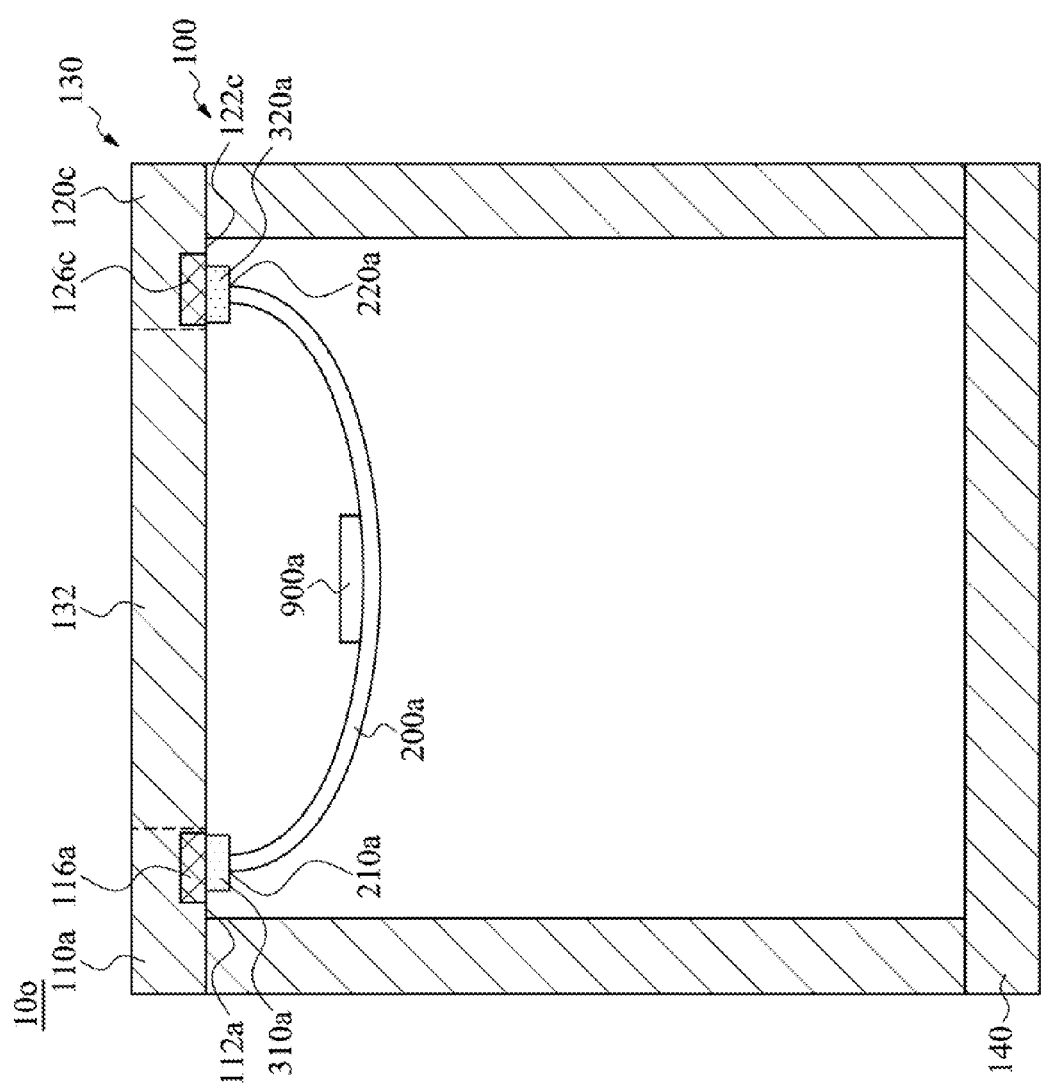

FIG. 17 is a cross-sectional view of the electronic apparatus 10o in accordance with the sixteenth embodiment of the present invention. As shown in FIG. 17, the main difference between this embodiment and FIG. 8 is that: a portion of the cover 130 serves as the first frame body 110a, and another portion of the cover 130 serves as the second frame body 120c. The flexible circuit board 200a is connected to the first frame body 110a and second frame body 120c that are different portions of the cover 130. In some embodiments, the first frame body 110a includes a first inner surface 112a, the second frame body 120c includes a second inner surface 122c, and the first and second inner surfaces 112a and 122c are substantially coplanar. For example, the first and second inner surface 112a and 122c are different portions of an inner surface of the cover 130, and these portions are substantially coplanar. The first and second connectors 310a and 320a are respectively disposed on the substantially coplanar first and second inner surfaces 112a and 122c. The first and second edges 210a and 220a of the flexible circuit board 200a are respectively plugged in the first and second connectors 310a and 320a on the substantially coplanar surfaces.

Figure 18:
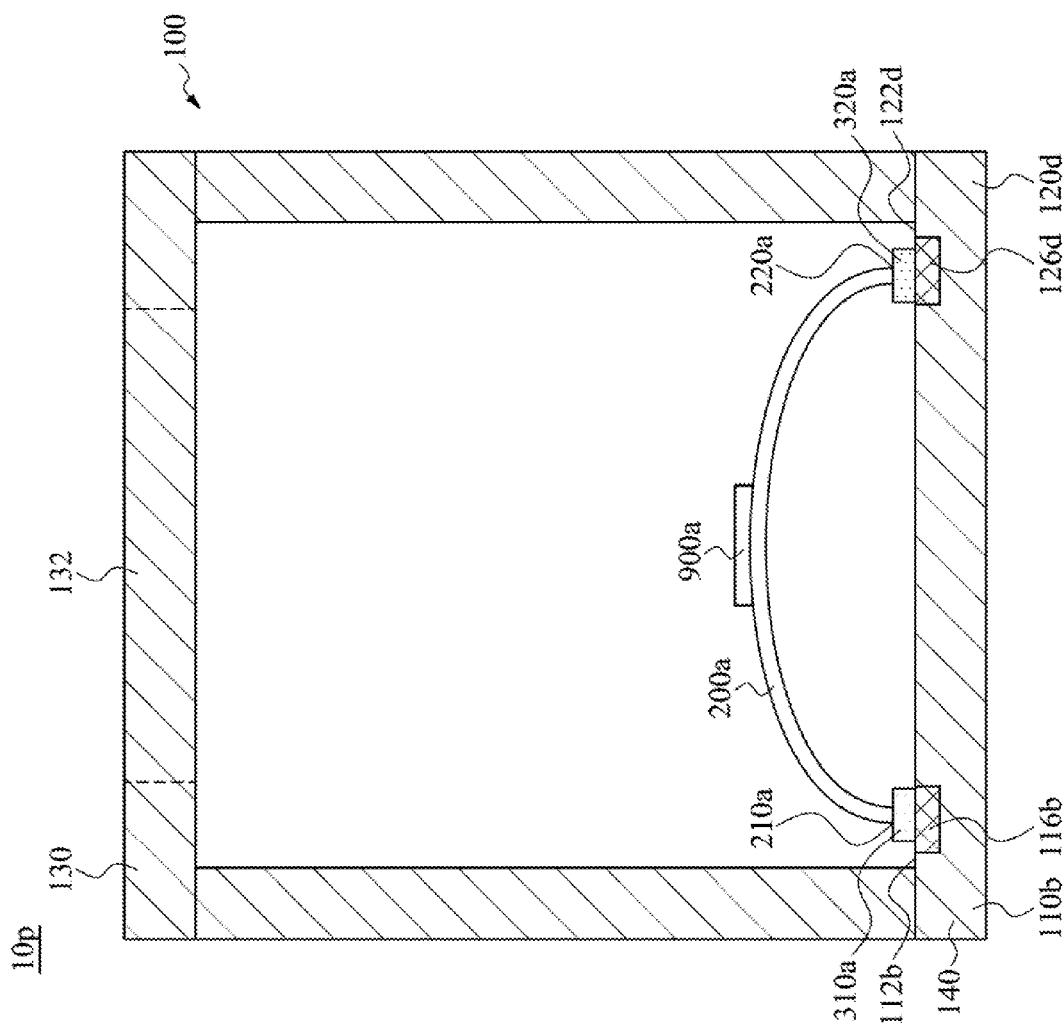

FIG. 18 is a cross-sectional view of the electronic apparatus 10p in accordance with the seventeenth embodiment of the present invention. As shown in FIG. 18, the main difference between this embodiment and FIG. 8 is that: a portion of the base 140 serves as the first frame body 110b, and another portion of the base 140 serves as the second frame body 120d. The flexible circuit board 200a is connected to the first frame body 110b and second frame body 120d that are different portions of the base 140. In some embodiments, the first frame body 110b includes a first inner surface 112b, the second frame body 120d includes a second inner surface 122d, and the first and second inner surfaces 112b and 122d are substantially coplanar. For example, the first and second inner surface 112b and 122d are different portions of an inner surface of the base 140, and these portions are substantially coplanar. The first and second connectors 310a and 320a are respectively disposed on the substantially coplanar first and second inner surfaces 112b and 122b. The first and second edges 210a and 220a of the flexible circuit board 200a are respectively plugged in the first and second connectors 310a and 320a on the substantially coplanar surfaces.

Figure 19:
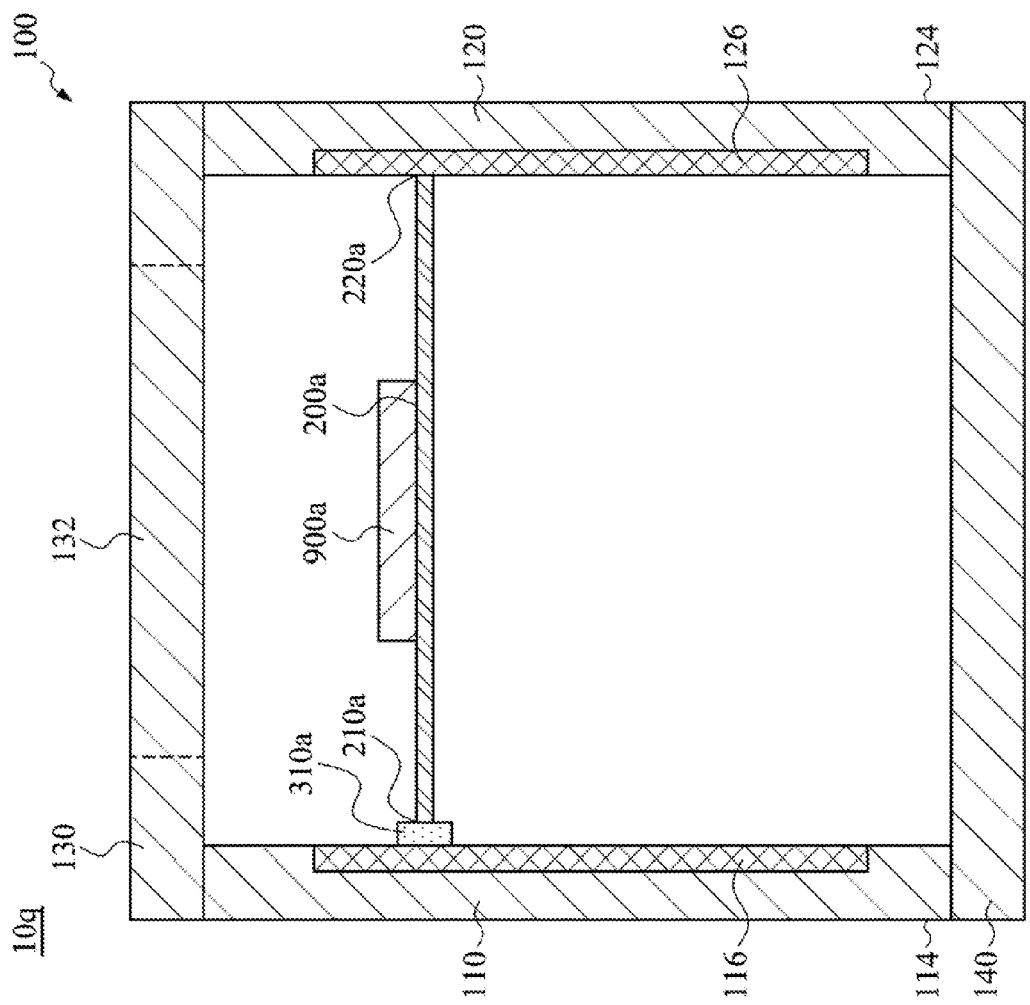

FIG. 19 is a cross-sectional view of the electronic apparatus 10q in accordance with the eighteenth embodiment of the present invention. As shown in FIG. 19, the main difference between this embodiment and FIG. 8 is that: the second connector 320a is omitted in this embodiment, and the second edge 220a of the flexible circuit board 200a is connected to the second wire 126 without connection by the second connector 320a. For example, the second edge 220a of the flexible circuit board 200a can be bonded or welded to the second wire 126. In some embodiments, the second edge 220a of the flexible circuit board 200a is connected to second frame body 120 without connecting to the second wire 126.

Figure 20:
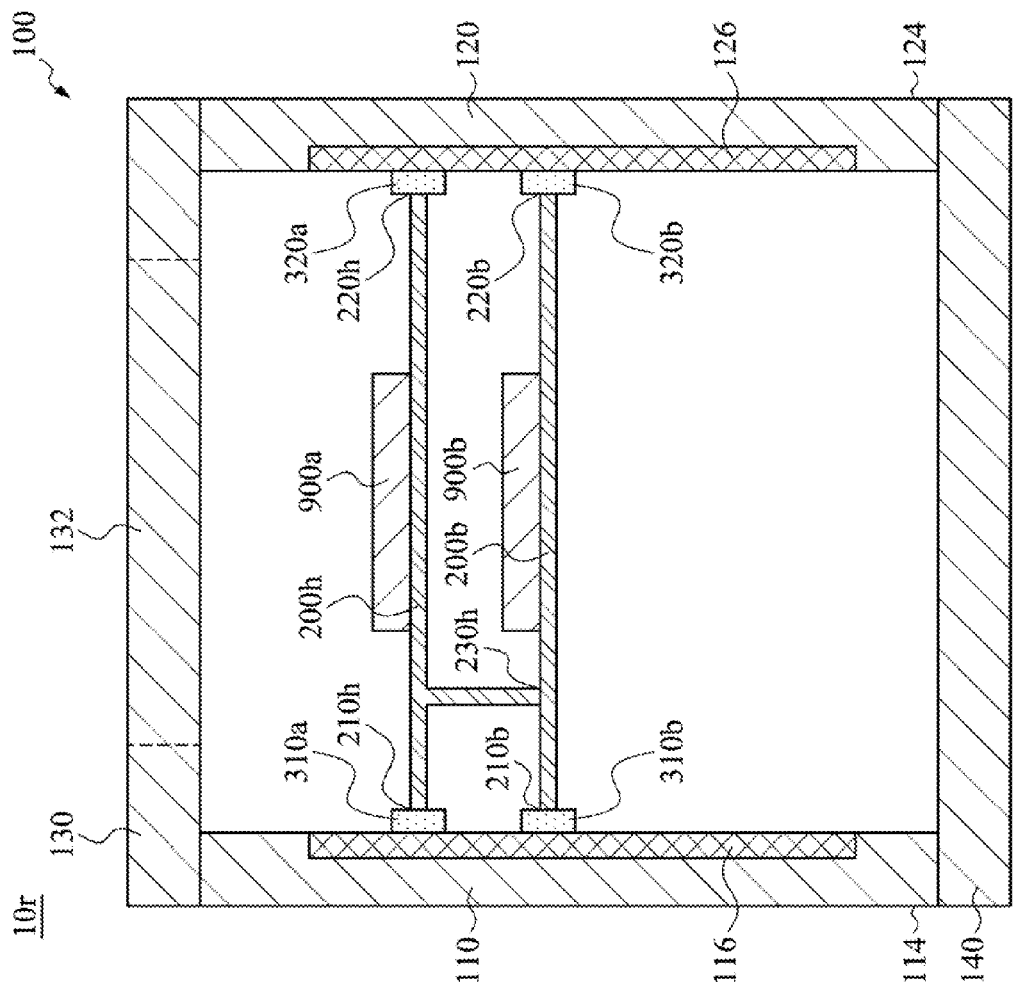

FIG. 20 is a cross-sectional view of the electronic apparatus 10r in accordance with the nineteenth embodiment of the present invention. As shown in FIG. 20, the main difference between this embodiment and FIG. 8 is that: the flexible circuit board 200h has first, second and third edges 210h, 220h and 230h. The first edge 210h is connected to the first connector 310a, the second edge 220h is connected to the second connector 320a, and the third edge 230h is connected to another flexible circuit board 200b.

Figure 21:
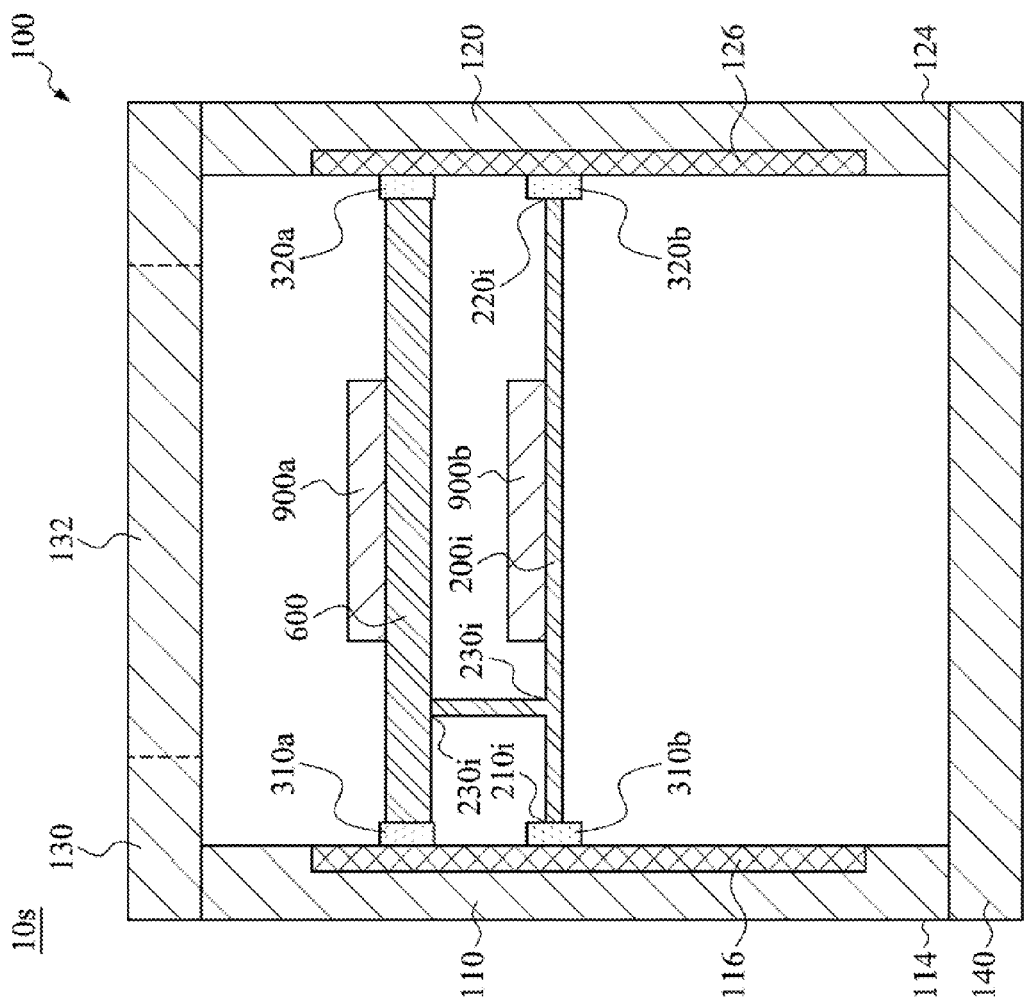

FIG. 21 is a cross-sectional view of the electronic apparatus 10s in accordance with the twentieth embodiment of the present invention. As shown in FIG. 21, the main difference between this embodiment and FIG. 8 is that: the flexible circuit board 200i has first, second and third edges 210i, 220i and 230i. The first edge 210i is connected to the first connector 310b, the second edge 220i is connected to the second connector 320b, and the third edge 230i is connected to the rigid circuit board 600.

Figure 22:
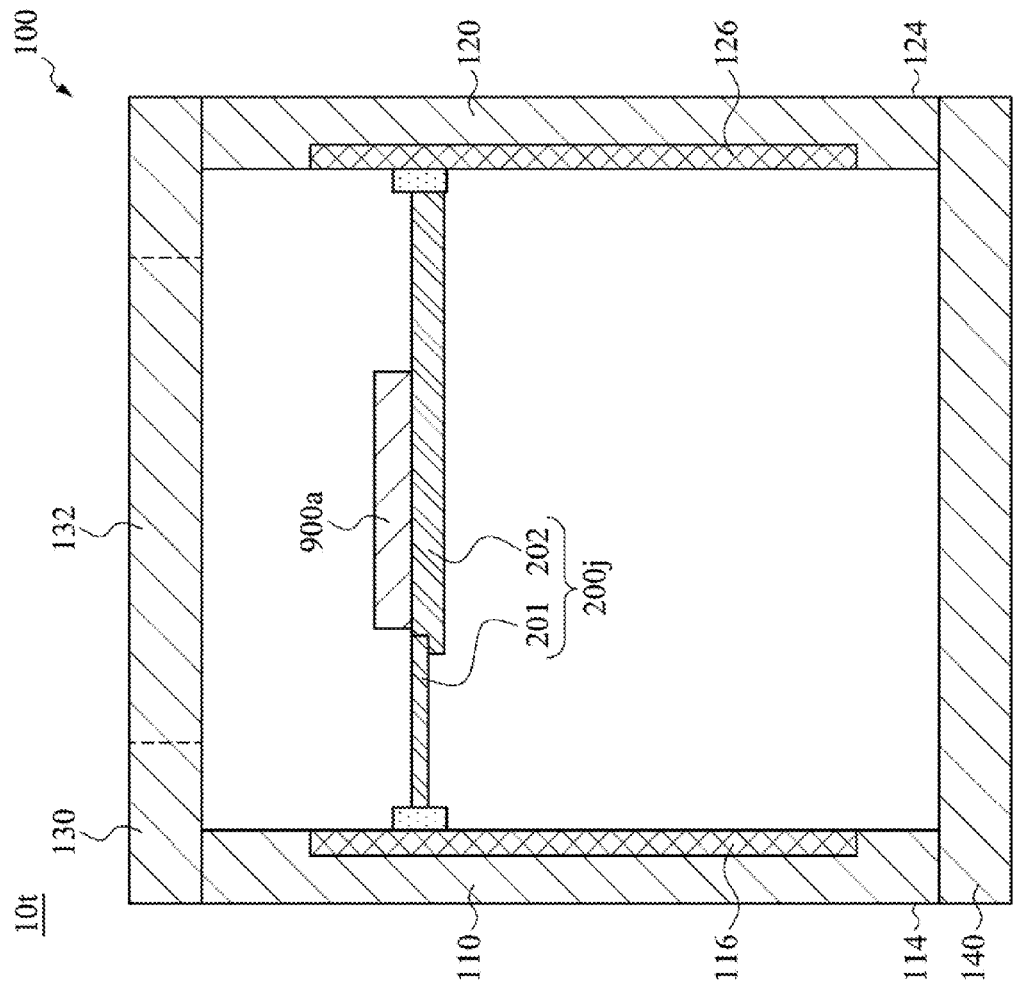

FIG. 22 is a cross-sectional view of the electronic apparatus 10t in accordance with the twenty-first embodiment of the present invention. As shown in FIG. 22, the main difference between this embodiment and FIG. 8 is that: the circuit board 200j is partially flexible. In other words, a portion of the circuit board 200j is flexible, and another portion of the circuit board is rigid. That is, a portion of the circuit board 200j is stiffer than the flexible portion of the circuit board 200j. More particularly, the flexible circuit board in the foregoing embodiments may integrally formed, while the circuit board 200j in this embodiment is not integrally formed, and it includes a plurality of sub-boards 201 and 202 that are connected. The sub-board 202 may be stiffer than the sub-board 201, and vice versa. For example, the sub-board 201 may be an FPC, while the sub-board 202 may be a PCB. In other embodiments, the sub-boards 201 and 202 may be both flexible. For example, the circuit board 200j may include a plurality of FPCs connected together.

In some embodiments, the circuit board 200j may take place of any one of the flexible circuit boards shown in the FIG. 1 to FIG. 21. Other features and the relations therebetween are the same as described in the first embodiment, and will not be described repeatedly.

In some embodiments, the first frame body 110, the second frame body 120, the cover 130 and the base 140 are integrally formed. In some other embodiments, the first frame body 110, the second frame body 120, the cover 130 and the base 140 are individual pieces that are connected together.

In some embodiments, the electronic apparatus may include a circuit board frame (not shown) that encompasses the circuit board or flexible circuit board described in the foregoing embodiments. In some embodiments, there are a plurality of circuit board frames respectively encompassing the circuit boards or the flexible circuit boards described in the foregoing embodiments.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electronic apparatus comprising:
    a frame comprising a first frame body and a second frame body, wherein the first frame body comprises a first inner surface and a first wire embeddedly retained in a recess of the first frame body that extends from the first inner surface and terminates in an interior of the first frame body;
    a circuit board, wherein a portion of the circuit board is flexible, the circuit board comprises a first edge and a second edge, the first edge is connected to the first frame body, and the second edge is connected to the second frame body, wherein the circuit board is electrically connected to the first wire;
    a hardware device disposed on the circuit board; and
    a first connector, wherein the first connector is disposed on the first inner surface and electrically connected to the first wire, and the first edge of the circuit board is plugged in the first connector.

2. The electronic apparatus of claim 1, wherein the second frame body comprises a second wire therein, and the circuit board is electrically connected between the first wire and the second wire.

3. The electronic apparatus of claim 2, further comprising:
    a second connector, wherein the second frame body comprises a second inner surface, and the second connector is disposed on the second inner surface and electrically connected to the second wire, and the second edge of the circuit board is plugged in the second connector.

4. The electronic apparatus of claim 1, further comprising:
    a rigid circuit board, wherein a flexural strength of the flexible portion of the circuit board is greater than a flexural strength of the rigid circuit board, and the rigid circuit board is connected between the first frame body and the second frame body.

5. The electronic apparatus of claim 1, wherein the frame comprises a cover positioned across the first frame body and the second frame body.

6. The electronic apparatus of claim 5, wherein the cover has a light-transmissive area, and a projection position of the light-transmissive area on the circuit board overlaps with the hardware device.

7. The electronic apparatus of claim 6, wherein the hardware device is a display panel, and the display panel is exposed to the light-transmissive area.

8. The electronic apparatus of claim 1, wherein an amount of the circuit board is plural, and the circuit boards are spaced apart from each other.

9. The electronic apparatus of claim 1, wherein the second frame body comprises a second inner surface, the second edge is connected to the second inner surface, and wherein the first inner surface and the second inner surface are opposite.

10. The electronic apparatus of claim 1, wherein the second frame body comprises a second inner surface, the second edge is connected to the second inner surface, and wherein the first inner surface and the second inner surface are adjacent.

11. The electronic apparatus of claim 1, wherein the second frame body comprises a second inner surface, the second edge is connected to the second inner surface, and wherein the first inner surface and the second inner surface are substantially coplanar.

12. The electronic apparatus of claim 1, wherein a portion of the circuit board is stiffer than the flexible portion of the circuit board.

13. The electronic apparatus of claim 1, wherein the circuit board is integrally formed.

14. The electronic apparatus of claim 1, wherein the circuit board comprises a plurality of sub-boards that are connected.

15. The electronic apparatus of claim 14, wherein at least one of the sub-boards is stiffer than another of the sub-boards.

16. The electronic apparatus of claim 14, wherein at least two of the sub-boards are flexible.

17. The electronic apparatus of claim 1, wherein an amount of the circuit board is plural, and at least one of the circuit boards has a third edge, and the third edge is connected to another of the circuit boards.

18. The electronic apparatus of claim 1, further comprising:
   at least one rigid circuit board connected between the first frame body and the second frame body, wherein a flexural strength of the flexible portion of the circuit board is greater than a flexural strength of the rigid circuit board,
   wherein the circuit board has a third edge, and the third edge is connected to the rigid circuit board.

19. The electronic apparatus of claim 1, further comprising:
   a second connector, wherein the second frame body comprises a second inner surface and a second wire, and the second connector is disposed on the second inner surface and electrically connected to the second wire, and the second edge of the circuit board is plugged in the second connector,
   wherein at least two of an amount of the a circuit board, an amount of the a first connector and an amount of the second connector are unequal.

20. The electronic apparatus of claim 1, further comprising:
   a second connector, wherein the second frame body comprises a second inner surface and a second wire, and the second connector is disposed on the second inner surface and electrically connected to the second wire, and the second edge of the circuit board is plugged in the second connector,
   wherein at least two of an amount of the a circuit board, an amount of the a first connector and an amount of the second connector are equal.

* * * * *